(12) United States Patent
Chang et al.

(10) Patent No.: US 11,139,211 B2
(45) Date of Patent: Oct. 5, 2021

(54) SELECTIVE NFET/PFET RECESS OF SOURCE/DRAIN REGIONS

(71) Applicant: Taiwan Semiconductor Manufacturing Company, Ltd., Hsinchu (TW)

(72) Inventors: Yun-Min Chang, Hsinchu (TW); Chien-An Chen, Hsinchu (TW); Guan-Ren Wang, Hsinchu (TW); Peng Wang, Hsinchu (TW); Huang-Ming Chen, Hsinchu (TW); Huan-Just Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/779,876

(22) Filed: Feb. 3, 2020

(65) Prior Publication Data

US 2020/0185278 A1    Jun. 11, 2020

Related U.S. Application Data

(63) Continuation of application No. 15/966,858, filed on Apr. 30, 2018, now Pat. No. 10,553,492.

(51) Int. Cl.
*H01L 21/8234* (2006.01)
*H01L 29/66* (2006.01)
(Continued)

(52) U.S. Cl.
CPC ........... *H01L 21/823418* (2013.01); *H01L 21/31116* (2013.01); *H01L 21/76802* (2013.01);
(Continued)

(58) Field of Classification Search
CPC ....... H01L 21/823418; H01L 29/66545; H01L 21/31116; H01L 21/76802;
(Continued)

(56) References Cited

U.S. PATENT DOCUMENTS

| 5,972,783 A | 10/1999 | Arai et al. |
| 6,239,022 B1 | 5/2001 | Seo et al. |

(Continued)

FOREIGN PATENT DOCUMENTS

| KR | 20010004644 A | 1/2001 |
| KR | 20120053511 A | 5/2012 |
| KR | 20160035504 A | 3/2016 |

*Primary Examiner* — Yasser A Abdelaziez
(74) *Attorney, Agent, or Firm* — Slater Matsil, LLP

(57) ABSTRACT

A method includes forming an inter-layer dielectric over a first source/drain region and a second source/drain region. The first source/drain region and the second source/drain region are of n-type and p-type, respectively. The inter-layer dielectric is etched to form a first contact opening and a second contact opening, with the first source/drain region and the second source/drain region exposed to the first contact opening and the second contact opening, respectively. A process gas is used to etch back the first source/drain region and the second source/drain region simultaneously, and a first etching rate of the first source/drain region is higher than a second etching rate of the second source/drain region. A first silicide region and a second silicide region are formed on the first source/drain region and the second source/drain region, respectively.

20 Claims, 26 Drawing Sheets

(51) Int. Cl.
*H01L 21/311* (2006.01)
*H01L 21/768* (2006.01)
*H01L 29/78* (2006.01)
*H01L 27/088* (2006.01)

(52) U.S. Cl.
CPC .. *H01L 21/823431* (2013.01); *H01L 27/0886* (2013.01); *H01L 29/66545* (2013.01); *H01L 29/66795* (2013.01); *H01L 29/785* (2013.01); *H01L 29/7848* (2013.01)

(58) Field of Classification Search
CPC ......... H01L 21/823431; H01L 29/7848; H01L 29/785; H01L 27/0886; H01L 29/66795; H01L 21/76831; H01L 23/485; H01L 21/28518; H01L 21/76855; H01L 21/76805; H01L 21/76897; H01L 21/76843; H01L 21/76865; H01L 27/0924; H01L 21/823821; H01L 21/3065; H01L 21/823814; H01L 29/165; H01L 29/0847; H01L 29/7853; H01L 29/66803; H01L 21/76816; H01L 21/76877; H01L 23/5283

See application file for complete search history.

(56) References Cited

U.S. PATENT DOCUMENTS

| | | |
|---|---|---|
| 9,748,389 B1 | 8/2017 | Lee et al. |
| 2006/0226120 A1 | 10/2006 | Rusu et al. |
| 2007/0181977 A1 | 8/2007 | Lochtefeld et al. |
| 2010/0062224 A1* | 3/2010 | Witvrouw ........... B81C 1/00246 428/172 |
| 2011/0263092 A1* | 10/2011 | Cheng ............. H01L 21/823425 438/300 |
| 2012/0178230 A1 | 7/2012 | Wang |
| 2012/0187460 A1 | 7/2012 | Lavoie et al. |
| 2014/0061939 A1 | 3/2014 | Yu et al. |
| 2015/0279840 A1 | 10/2015 | Huang et al. |
| 2016/0020301 A1 | 1/2016 | Park et al. |
| 2016/0087053 A1 | 3/2016 | Kim et al. |
| 2016/0190322 A1 | 6/2016 | Liu et al. |
| 2016/0233335 A1* | 8/2016 | Dasaka ................ H01L 29/165 |
| 2018/0040733 A1 | 2/2018 | Chang et al. |
| 2018/0286810 A1* | 10/2018 | You .................... H01L 29/41791 |
| 2019/0165171 A1 | 5/2019 | Huang et al. |
| 2019/0312117 A1 | 10/2019 | Qi et al. |

* cited by examiner

SELECTIVE NFET/PFET RECESS OF SOURCE/DRAIN REGIONS

PRIORITY CLAIM AND CROSS-REFERENCE

This application is a continuation of U.S. patent application Ser. No. 15/966,858, entitled "Selective NFET/PFET Recess of Source/Drain Regions," filed on Apr. 30, 2018, which application is incorporated herein by reference.

BACKGROUND

With the sizes of integrated circuits becoming increasingly smaller, the respective formation processes also become increasingly more difficult, and problems may occur where conventionally no problems have occurred. For example, in the formation of Fin Field-Effect Transistors (FinFETs), the sizes of source/drain regions become increasingly smaller, making contact resistance increasingly higher.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
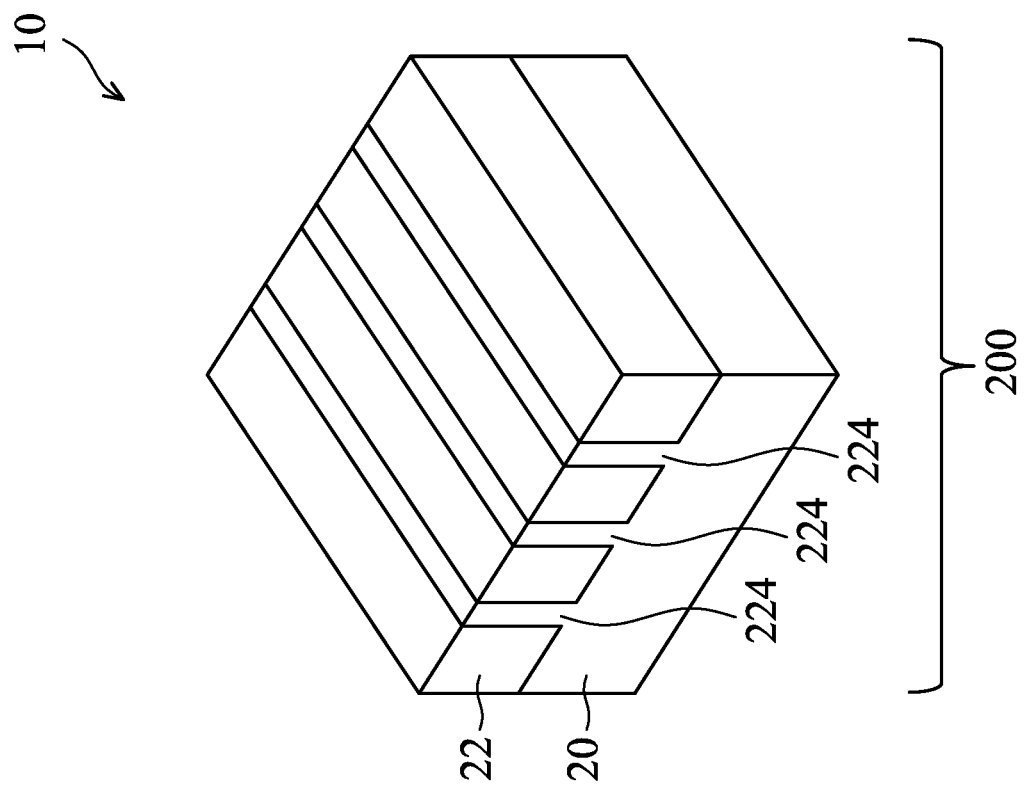
FIGS. 1 through 20 illustrate the cross-sectional views and perspective views of intermediate stages in the formation of an n-type Fin Field-Effect Transistors (FinFET) and a p-type FinFET in accordance with some embodiments.
Figure 1:
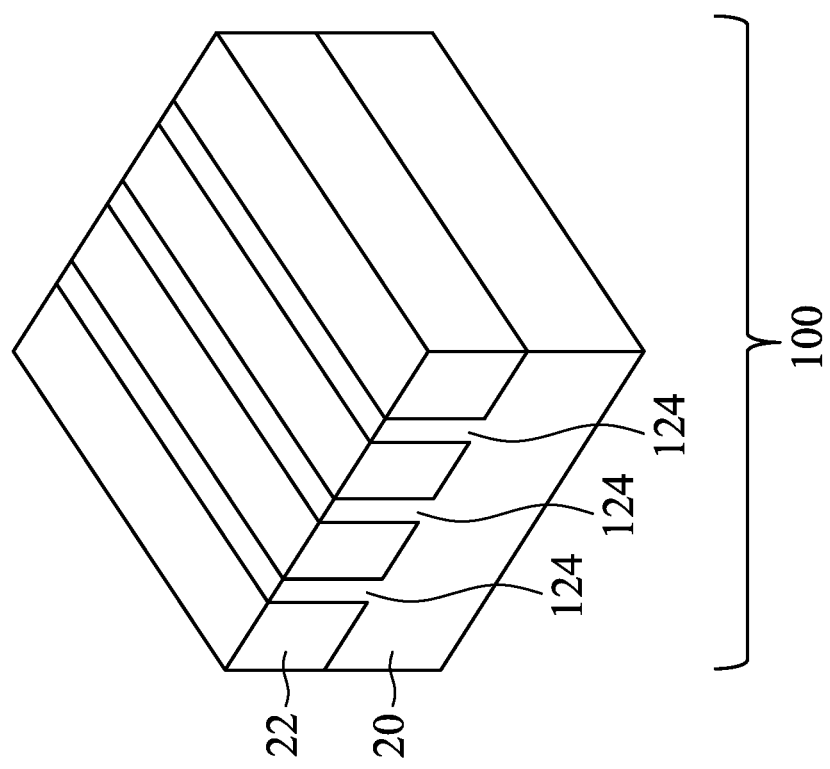

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors and the methods of forming the same are provided in accordance with various embodiments. The intermediate stages of forming the transistors are illustrated in accordance with some embodiments. Some variations of some embodiments are discussed. Throughout the various views and illustrative embodiments, like reference numbers are used to designate like elements. In some illustrated embodiments, the formation of Fin Field-Effect Transistors (FinFETs) is used as an example to explain the concepts of the present disclosure. Other transistors such as planar transistors may also adopt the concept of the present disclosure.

FIGS. 1 through 20 illustrate the cross-sectional views and perspective views of intermediate stages in the formation of transistors (which may be FinFETs, for example) in accordance with some embodiments of the present disclosure. The steps shown in FIGS. 1 through 20 are also reflected schematically in the process flow 300 shown in FIG. 21. The formed transistors include a first transistor in device region 100 and a second transistor in device region 200. In accordance with some embodiments of the present disclosure, the transistor formed in device region 100 is an n-type FinFET, and the transistor formed in device region 200 is a p-type FinFET.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. In accordance with some embodiments, substrate 20 includes a bulk silicon substrate and an epitaxy silicon germanium (SiGe) layer or a germanium layer (without silicon therein) over the bulk silicon substrate. Substrate 20 may be doped with a p-type or an n-type impurity. Isolation regions 22 such as Shallow Trench Isolation (STI) regions may be formed to extend into substrate 20. The portions of substrate 20 between neighboring STI regions 22 are referred to as semiconductor strips 124 and 224, which are in device regions 100 and 200, respectively.

STI regions 22 may include a liner oxide (not shown). The liner oxide may be formed of a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on coating, or the like.

Figure 2:
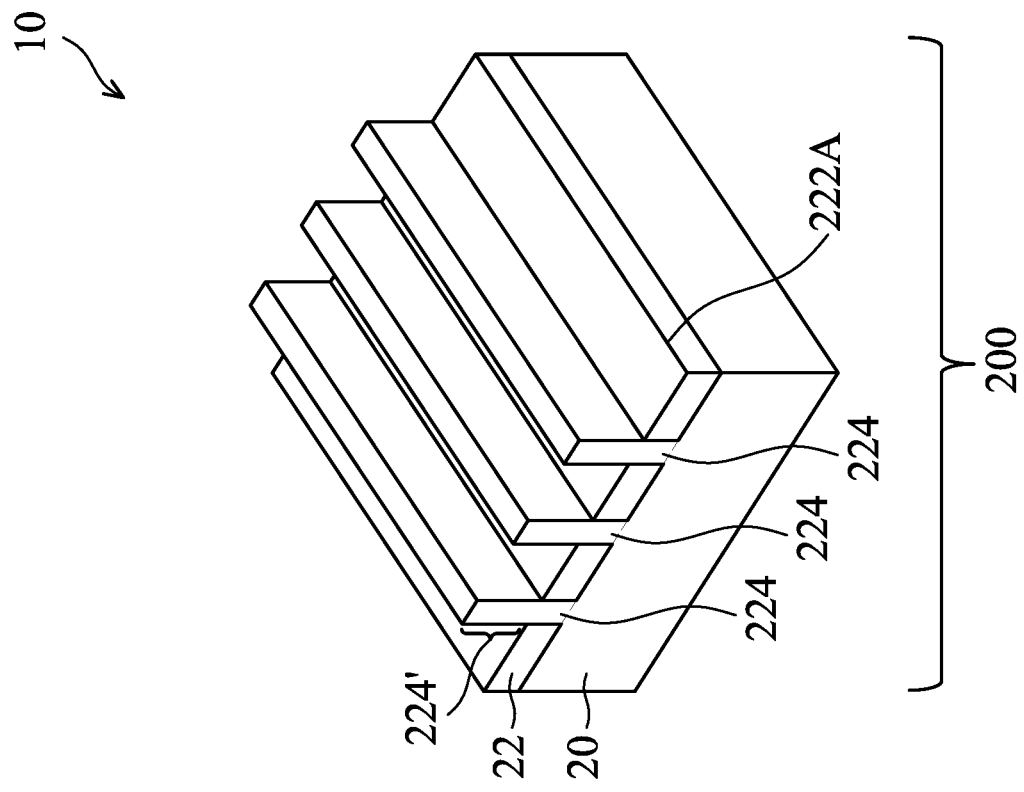
Figure 2:
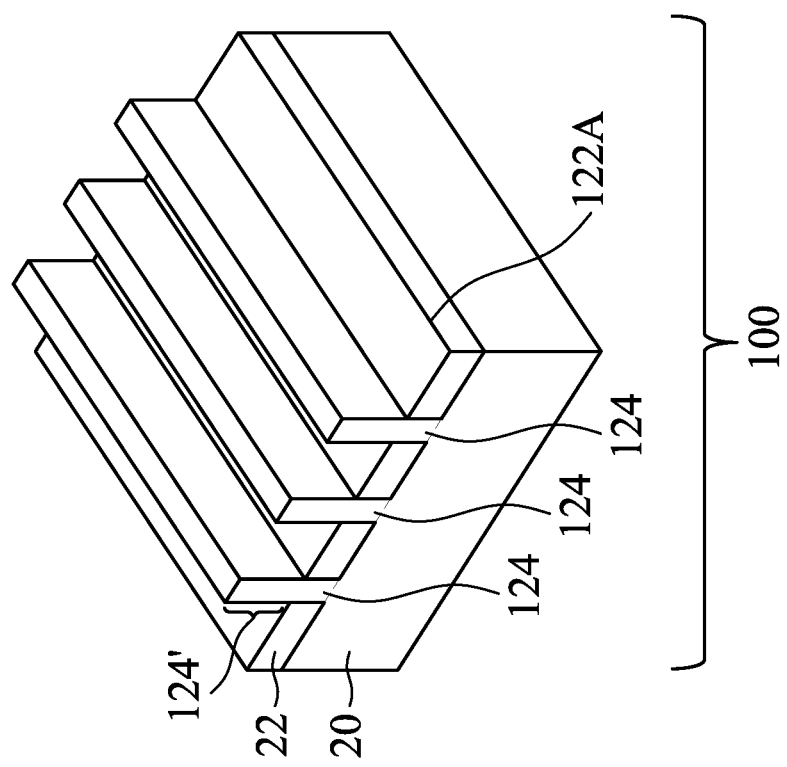
Figure 21:
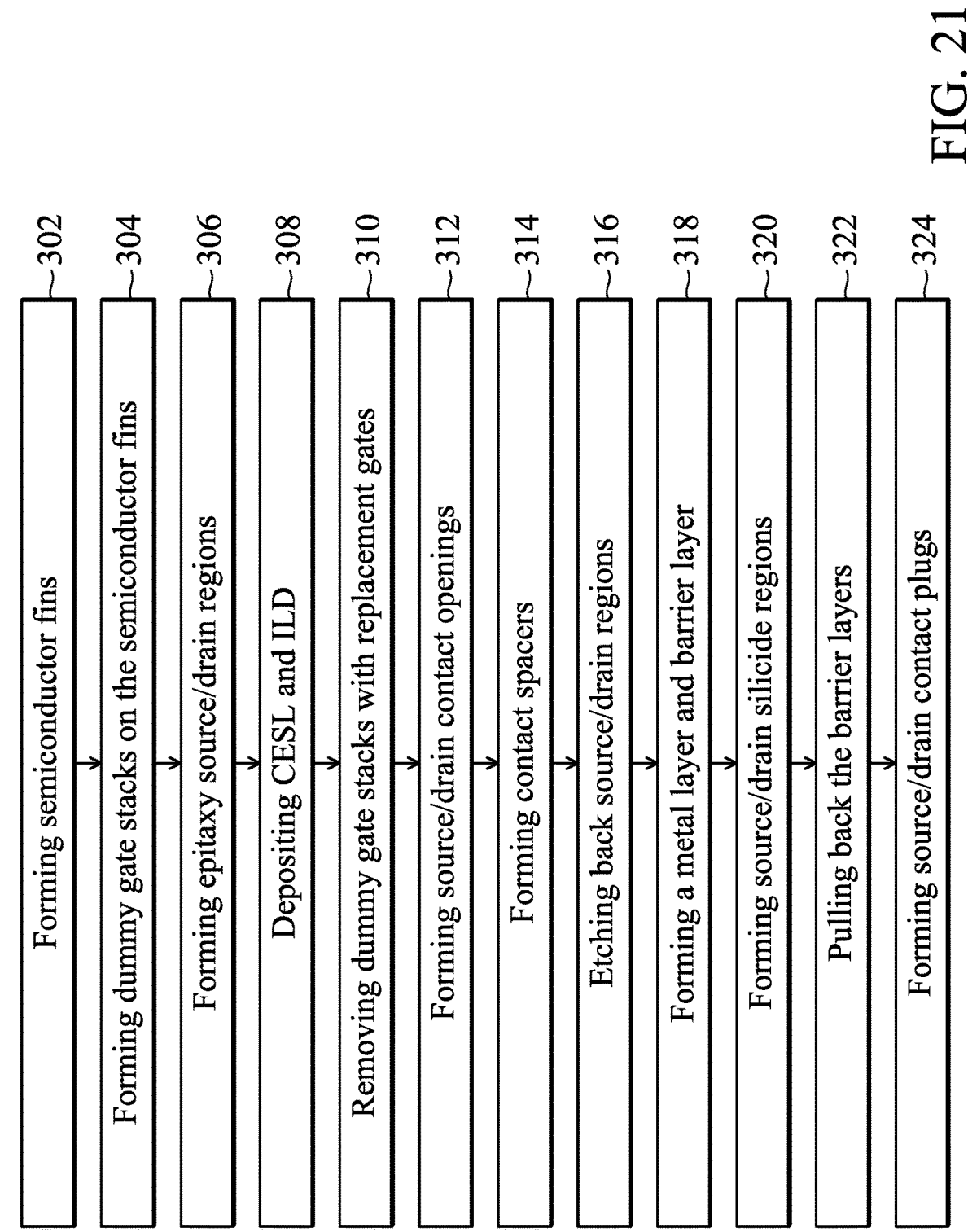
FIG. 21 illustrates a process flow for forming FinFETs in accordance with some embodiments.

Referring to FIG. 2, STI regions 22 are recessed, so that the top portions of semiconductor strips 124 and 224 protrude higher than the top surfaces 122A and 222A of the neighboring STI regions 22 to form protruding fins 124' and 224'. The respective process is illustrated as process 302 in the process flow 300 as shown in FIG. 21. The etching may be performed using a dry etching process, wherein $NH_3$ and $NF_3$ are used as the etching gases. During the etching process, plasma may be generated for the etching. Argon may also be included. In accordance with alternative embodiments of the present disclosure, the recessing of STI regions 22 is performed using a wet etch process. The etching chemical may include diluted HF solution, for example.

Figure 3:
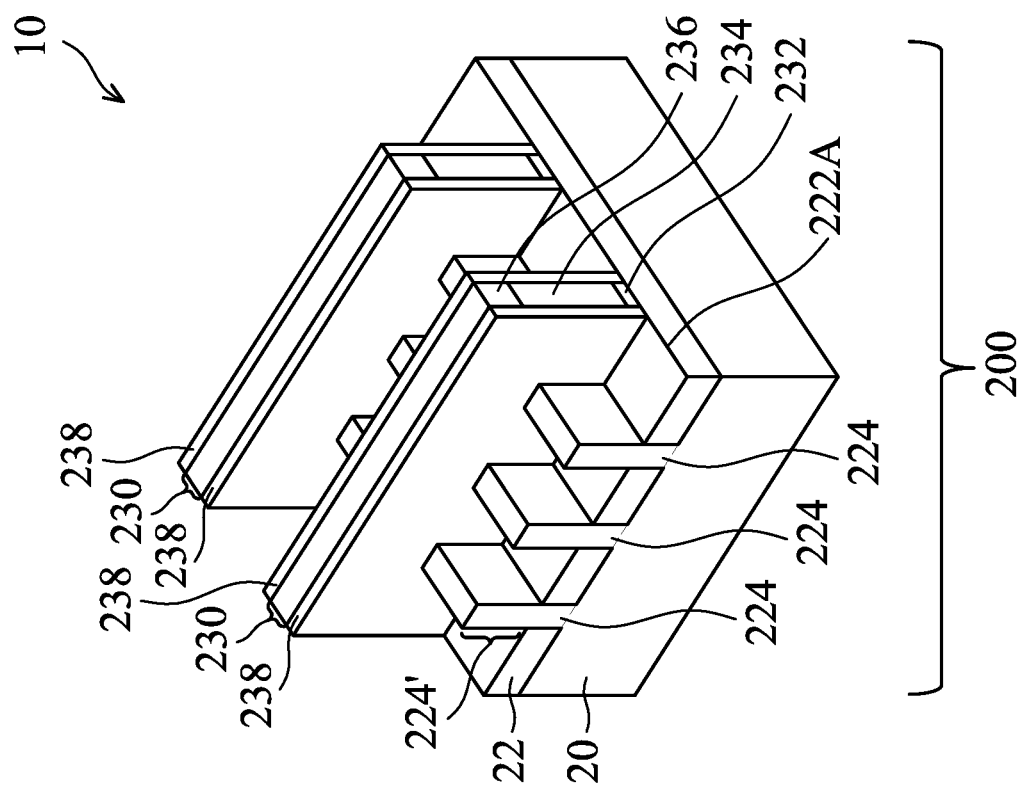
Figure 3:
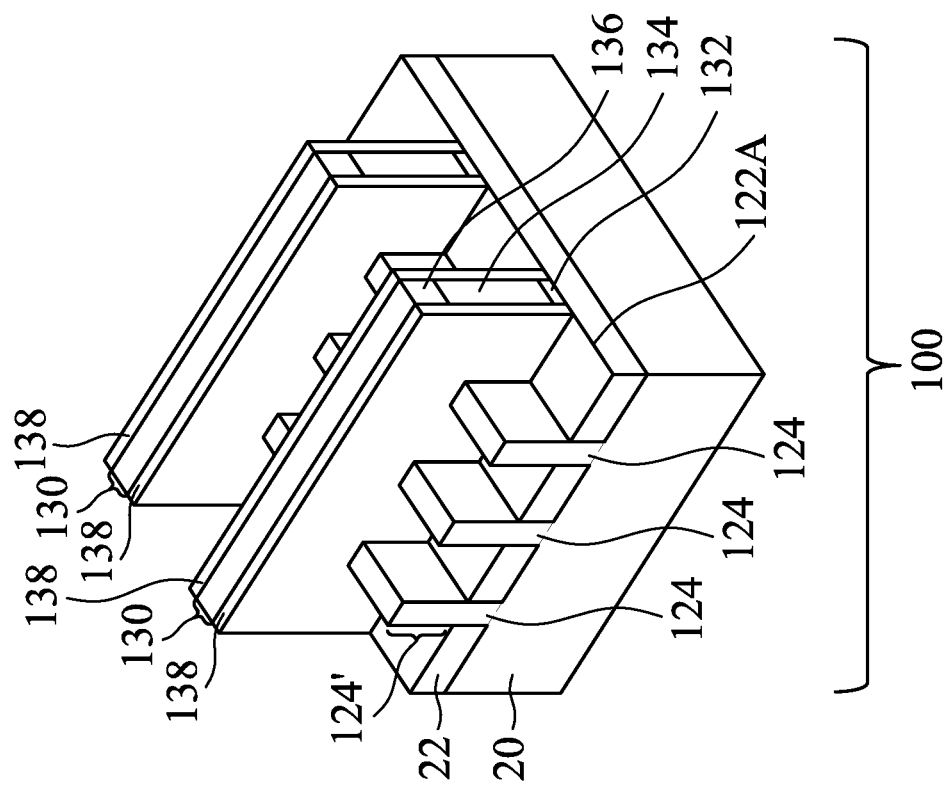

Referring to FIG. 3, dummy gate stacks 130 and 230 are formed on the top surfaces and the sidewalls of protruding fins 124' and 224', respectively. The respective process is illustrated as process 304 in the process flow 300 as shown in FIG. 21. Dummy gate stacks 130 may include gate dielectrics 132 and dummy gate electrodes 134 over dummy gate dielectrics 132. Dummy gate stacks 230 may include gate dielectrics 232 and dummy gate electrodes 234 over dummy gate dielectrics 232. Dummy gate electrodes 134 and 234 may be formed, for example, using amorphous silicon or polysilicon, and other materials may also be used. Each of dummy gate stacks 130 and 230 may also include one (or a plurality of) hard mask layers 136 and 236. Hard mask layers 136 and 236 may be formed of silicon nitride, silicon carbo-nitride, or the like. Each of dummy gate stacks 130 and 230 crosses over a single one or a plurality of protruding fins 124' and 224', respectively. Dummy gate stacks 130 and 230 may also have lengthwise directions perpendicular to the lengthwise directions of the respective protruding fins 124' and 224', respectively.

Next, gate spacers 138 and 238 are formed on the sidewalls of dummy gate stacks 130 and 230, respectively. In the meantime, fin spacers (not shown) may also be formed on the sidewalls of protruding fins 124' and 224'. In accordance with some embodiments of the present disclosure, gate spacers 138 and 238 are formed of a dielectric material(s) such as silicon carbon-oxynitride (SiCON), silicon nitride, or the like, and may have a single-layer structure or a multi-layer structure including a plurality of dielectric layers.

In accordance with some embodiments, each of gate spacers 138 includes a first dielectric layer 138A and a second dielectric layer 138B (not shown in FIG. 3, refer to FIG. 6B), with each of layers 138A and 138B formed through a blanket deposition step followed by an anisotropic etching step. In accordance with some embodiments, dielectric layer 138A is a low-k dielectric layer, and dielectric layer 138B is a non-low-k dielectric layer. Dielectric layer 138A may be formed of a low-k dielectric material having a dielectric constant (k value) lower than about 3.0, which may be formed of SiON or SiOCN, with pores formed therein in order to reduce its k value to a desired low-k value. Dielectric layer 138B may be formed of silicon nitride, for example. Gate spacers 238 have the same structure as gate spacers 138, and may include layers 238A and 238B (FIG. 6B) formed of the same materials as layers 138A and 138B, respectively. In accordance with other embodiments, dielectric layer 138A is a non-low-k dielectric layer, and dielectric layer 138B is a low-k dielectric layer, and the corresponding low-k dielectric material and non-low-k dielectric material may be similar to what are described above. Adopting low-k dielectric may reduce the parasitic capacitance between gate electrodes and source/drain regions.

Figure 4:
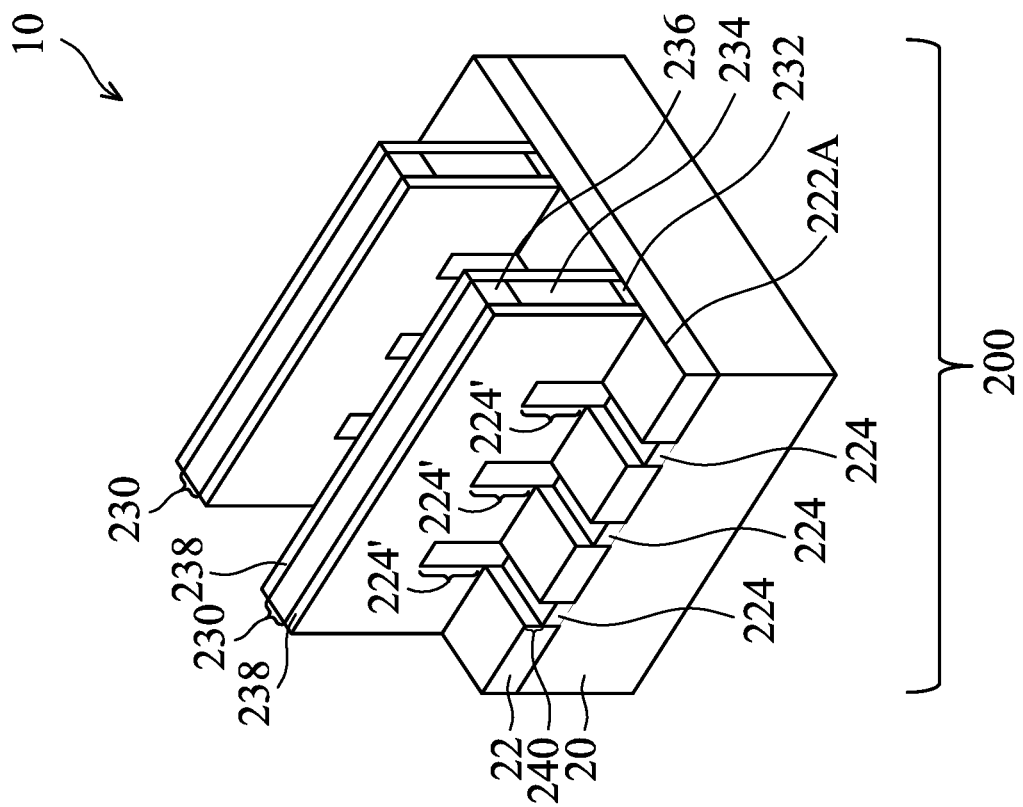
Figure 4:
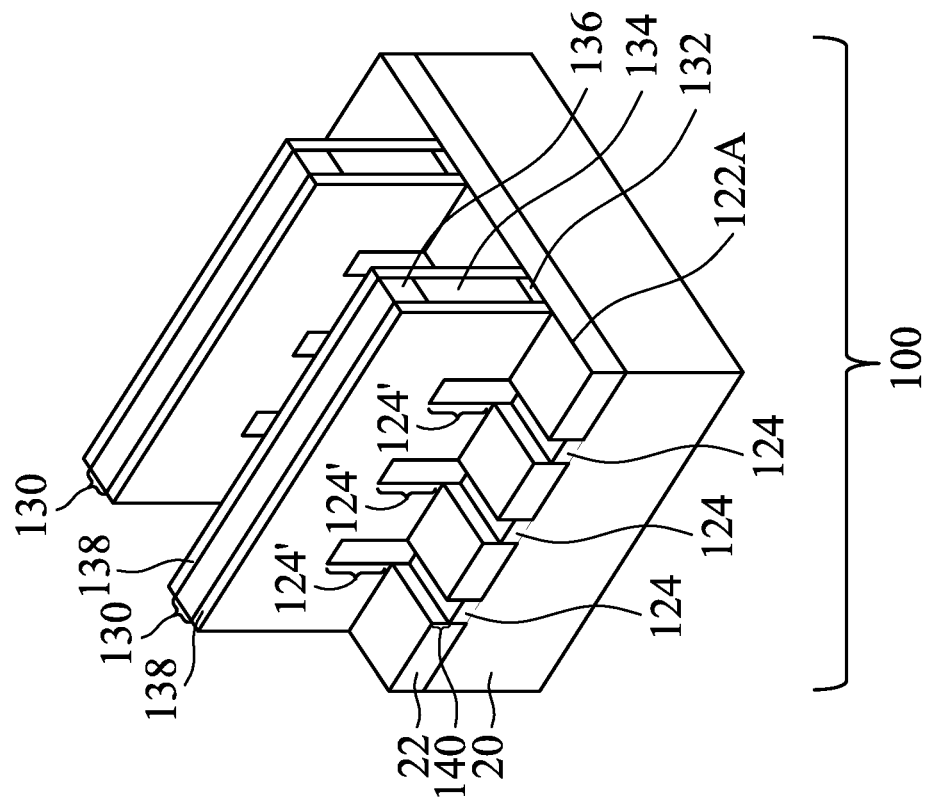

An etching step is then performed to etch the portions of protruding fins 124' and 224' that are not covered by dummy gate stacks 130 and 230 and gate spacers 138 and 238, resulting in the structure shown in FIG. 4. The recessing may be anisotropic, and hence the portions of fins 124' and 224' directly underlying the respective dummy gate stack 130/230 and gate spacers 138/238 are protected, and are not etched. The top surfaces of the recessed semiconductor strips 124 and 224 may be lower than the top surfaces of the adjacent STI regions 22 in accordance with some embodiments. Recesses 140 and 240 are accordingly formed between STI regions 22. The recessing in device regions 100 and 200 may be performed in a common etching process or in separate processes, and the depths of recesses 140 may be equal to or different from the depths of recesses 240.

Figure 5:
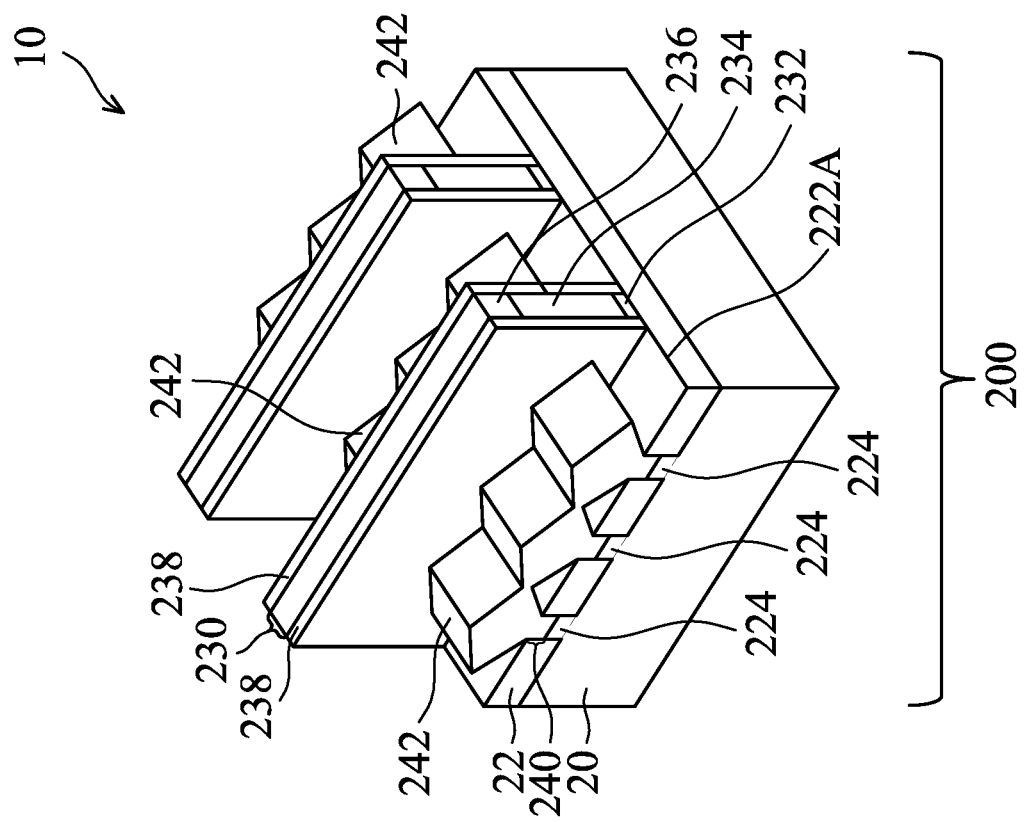
Figure 5:
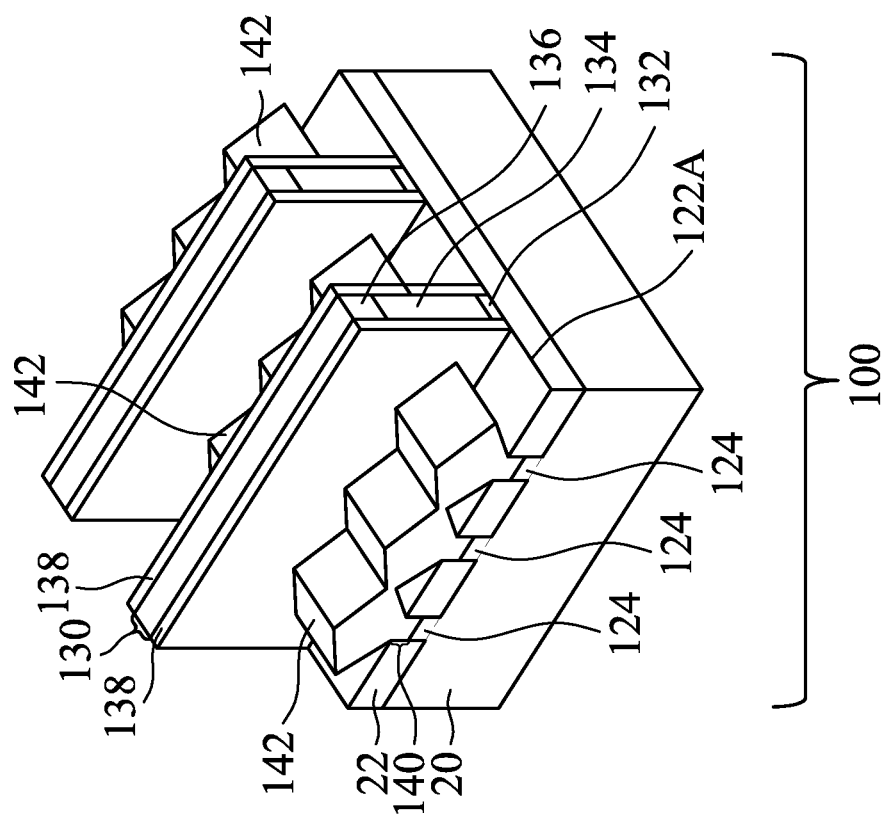

Next, epitaxy regions (source/drain regions) are formed by selectively growing a semiconductor material from recesses 140 and 240, resulting in the structure in FIG. 5. The respective process is illustrated as process 306 in the process flow 300 as shown in FIG. 21. In accordance with some embodiments, epitaxy regions 142 are formed of silicon phosphorous (SiP) or silicon carbon phosphorous (SiCP), which are of n-type. Epitaxy regions 242 may be formed of silicon germanium doped with boron (SiGeB) when the respective transistor in device region 200 is a p-type transistor. Epitaxy regions 242 may include a lower layer having a lower germanium concentration, and an upper layer having a higher concentration. In accordance with some embodiments, there may be, or may not be, a silicon cap (free from germanium) over the upper layer that has the high germanium concentration. For example, the lower layer may have a germanium atom percentage between about 20 percent and about 40 percent, and the upper layer may have a germanium atomic percentage between about 40 percent and about 75 percent.

The formation of epitaxy regions 142 and 242 are performed in separate processes and using different masks (not shown). In accordance with alternative embodiments of the present disclosure, epitaxy regions 142 and 242 are formed of III-V compound semiconductors such as GaAs, InP, GaN, InGaAs, InAlAs, GaSb, AlSb, AlAs, AlP, GaP, combinations thereof, or multi-layers thereof. After recesses 140 and 240 are filled with the epitaxy semiconductor material, the further epitaxial growth of epitaxy regions 142 and 242 causes epitaxy regions 142 and 242 to expand horizontally, and facets may be formed. The epitaxy regions grown from neighboring recesses may be merged to form a large epitaxy region, or may stay as discrete epitaxy regions when they are not merged. Epitaxy regions 142 and 242 form the source/drain regions of the respective transistors.

Figure 6A:
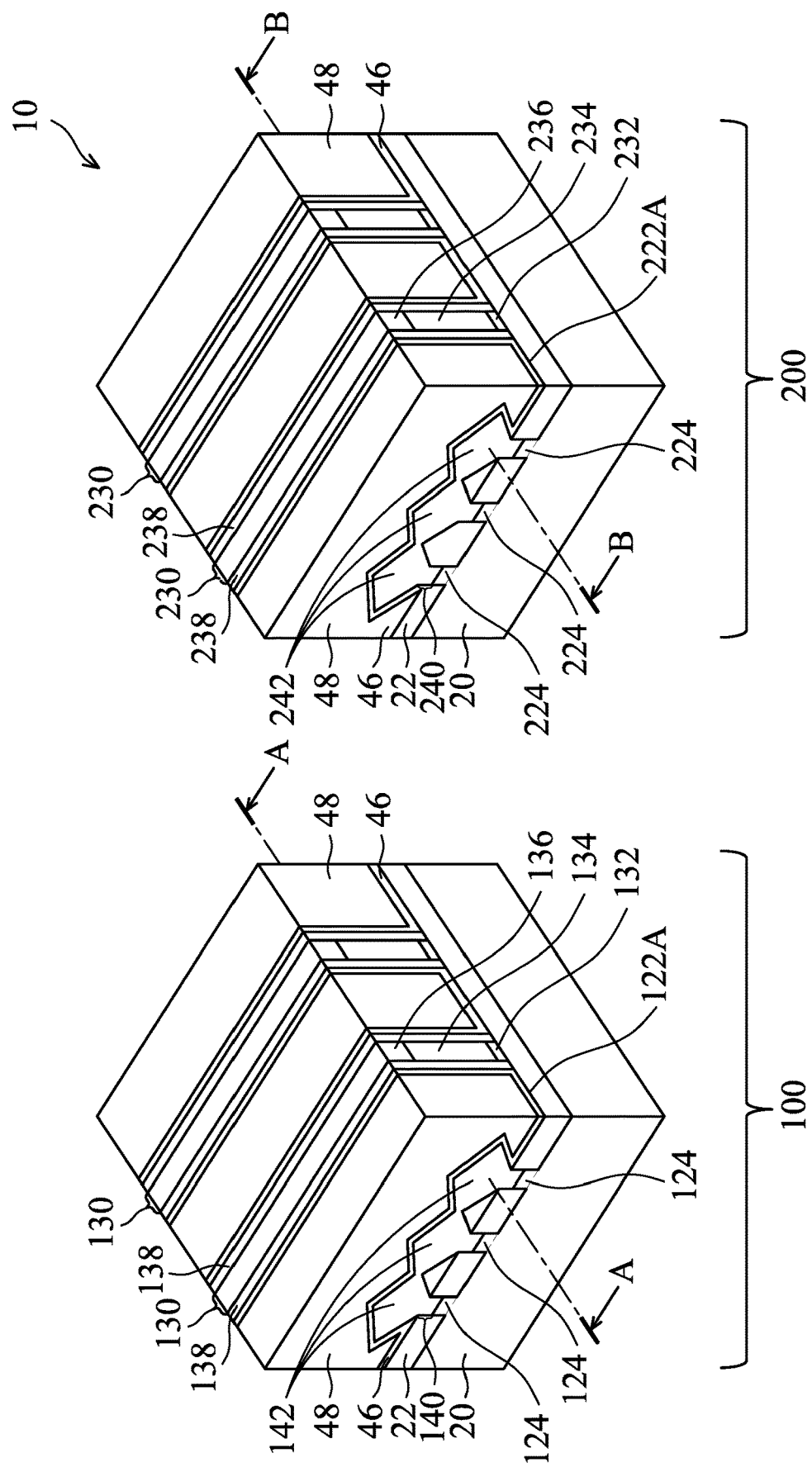

FIG. 6A illustrates a perspective view for depositing Contact Etch Stop Layer (CESL) 46 and Inter-Layer Dielectric (ILD) 48. The respective process is illustrated as process 308 in the process flow 300 as shown in FIG. 21. In accordance with some embodiments of the present disclosure, CESL 46 is formed of silicon nitride, silicon carbo-nitride, or the like. CESL 46 may be formed using a conformal deposition method such as ALD or CVD, for example. ILD 48 is formed over CESL 46, and may be formed using, for example, FCVD, spin-on coating, CVD, or the like. ILD 48 may be formed of Phospho-Silicate Glass (PSG), Boro-Silicate Glass (BSG), Boron-Doped Phospho-Silicate Glass (BPSG), Tetra Ethyl Ortho Silicate (TEOS) oxide, or the like. A planarization process such as a Chemical Mechanical Polish (CMP) process or a mechanical grinding process may be performed to level the top surfaces of ILD 48, dummy gate stacks 130 and 230, and gate spacers 138 and 238 with each other.

Figure 6B:
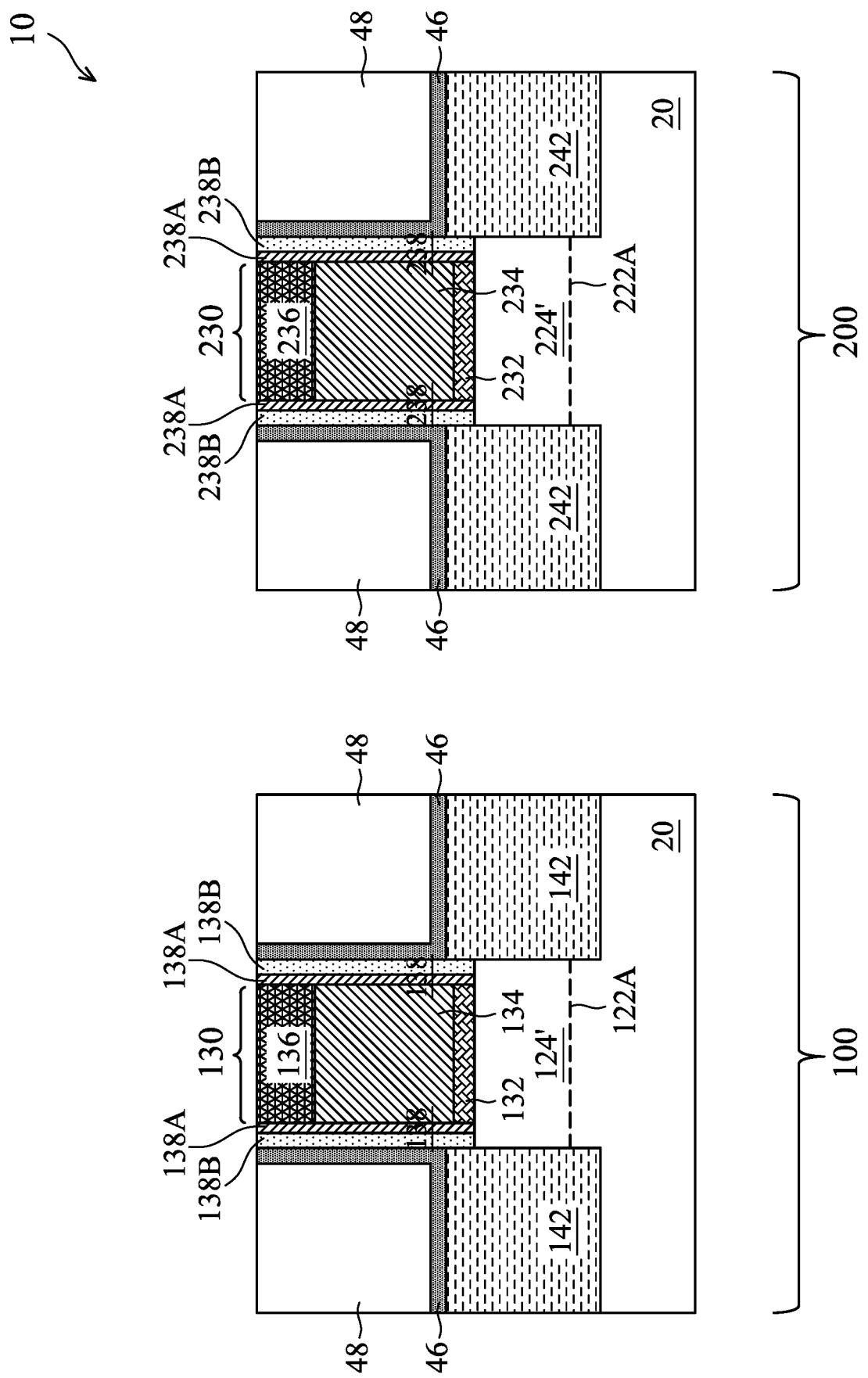

FIG. 6B illustrates the cross-sectional views of the structure shown in FIG. 6A, with the cross-sectional views being obtained from the vertical plane containing line A-A and the vertical plane containing line B-B in FIG. 6A. After the structure shown in FIGS. 6A and 6B is formed, the dummy gate stacks 130 and 230 including hard mask layers 136 and 236, dummy gate electrodes 134 and 234, and dummy gate dielectrics 132 and 232 are replaced with metal gates and replacement gate dielectrics. In FIG. 6B and subsequent cross-sectional views, the top surfaces 122A and 222A of STI regions 22 may be illustrated, and protruding fins 124' and 224' protrude higher than top surfaces 122A and 222A, respectively.

Figure 7A:
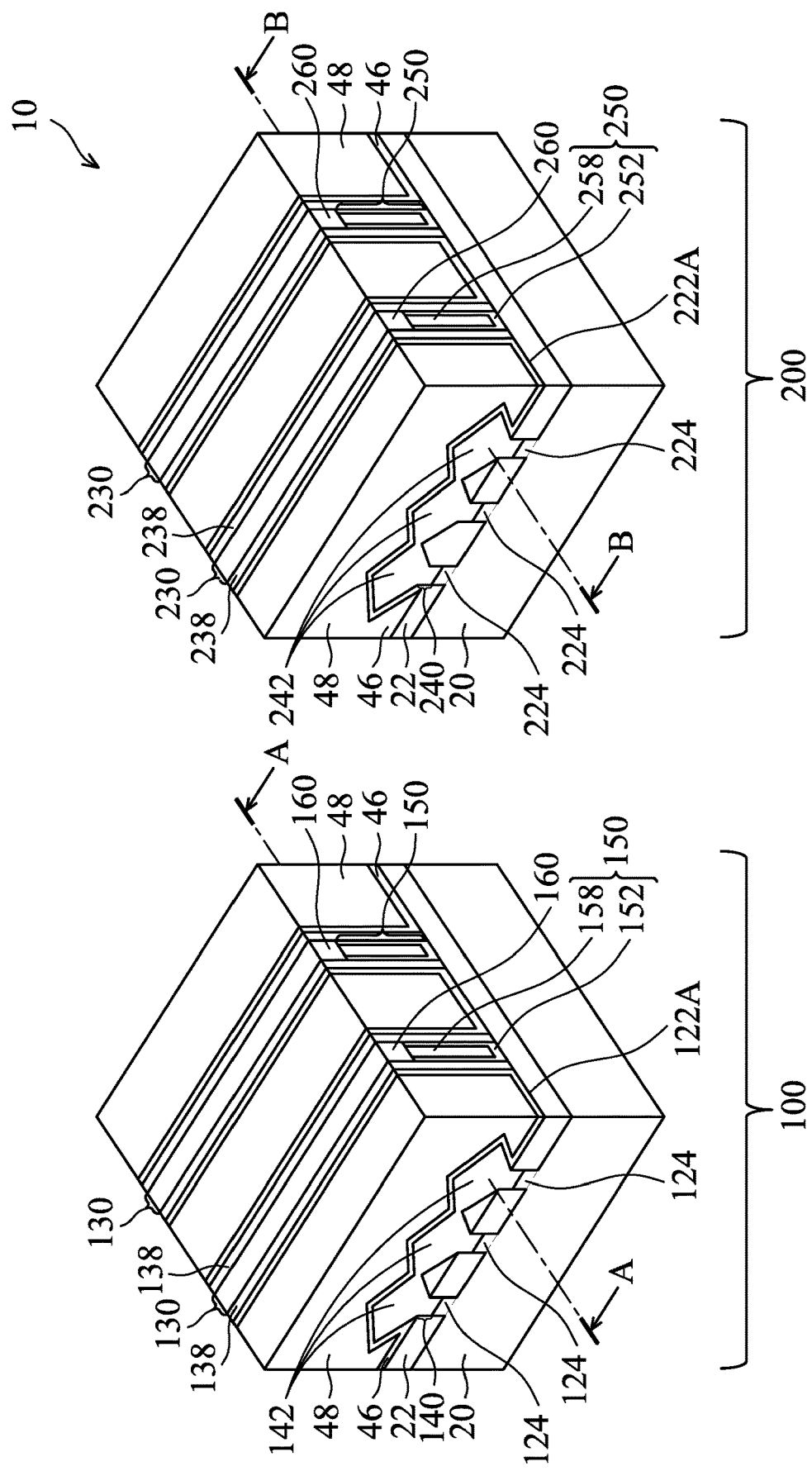
Figure 7B:
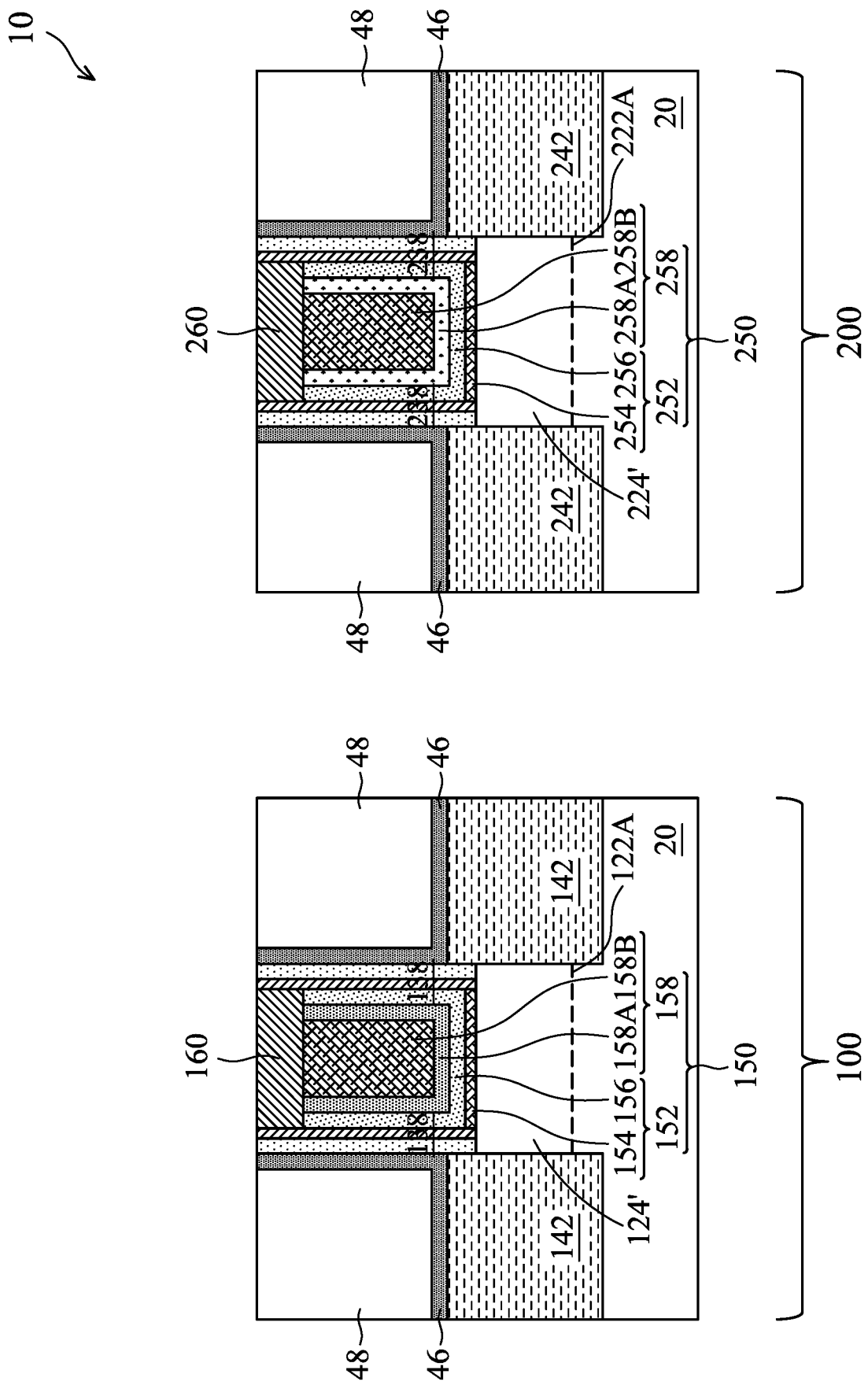

To form the replacement gates, hard mask layers 136 and 236, dummy gate electrodes 134 and 234, and dummy gate dielectrics 132 and 232 as shown in FIGS. 6A and 6B are removed through etching, forming trenches between gate spacers 138 and between gate spacers 238. The top surfaces and the sidewalls of protruding fins 124' and 224' are thus exposed to the resulting trenches. FIGS. 7A and 7B illustrate a perspective view and a cross-sectional view of portions of wafer 10 after replacement gate stacks 150 and 250 and hard masks 160 and 260 are formed in the trenches left by the removed dummy gate stacks. The respective process is illustrated as process 310 in the process flow 300 as shown in FIG. 21. In accordance with some embodiments of the present disclosure, gate dielectrics 152 and 252 include Interfacial Layers (ILs) 154 and 254 and the overlying high-k dielectrics 156 and 256, respectively, as shown in FIG. 7B. ILs 154 and 254 are formed on the exposed surfaces of protruding fins 124' and 224', respectively. Each of ILs 154 and 254 may include an oxide layer such as a silicon oxide layer, which is formed through the thermal oxidation of the surface layers of protruding fins 124' and 224', a chemical oxidation process, or a deposition process.

Also shown in FIG. 7B, gate dielectrics 152 and 252 may include high-k dielectric layers 156 and 256 formed over ILs 154 and 254, respectively. High-k dielectric layers 156 and 256 may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. High-k dielectric layers 156 and 256 are formed as conformal layers, and extend on the sidewalls of protruding fins 124' and 224' and the sidewalls of gate spacers 138 and 238. In accordance with some embodiments of the present disclosure, high-k dielectric layers 156 and 256 are formed using ALD or CVD.

Gate electrodes 158 and 258 (FIG. 7B) may include a plurality of stacked conductive sub-layers. The formation of gate electrodes 158 and 258 may be performed using a conformal deposition method such as ALD or CVD, so that the thickness of the vertical portions and the thickness of the horizontal portions of the lower sub-layers of gate electrodes 158 and 258 are substantially equal to each other.

Gate electrodes 158 and 258 may include metal layer 158A and 258A, respectively, each including a diffusion barrier layer and one (or more) work-function layer (not shown separately) over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, the work-function layer in metal layer 158A (of the n-type FinFET) may include a TaN layer and a titanium aluminum (TiAl) layer over the TaN layer. The work-function layer in metal layer 258A (of the p-type FinFET) may include a TaN layer, a TiN layer over the TaN layer, and a TiAl layer over the TiN layer. After the deposition of the work-function layer(s), a barrier layer, which may be another TiN layer, is formed.

Gate electrodes 158 and 258 may also include respective filling metals 158B and 258B filling the remaining trenches unfilled by the underlying sub-layers. The filling metal may be formed of tungsten or cobalt, for example. After the formation of the filling material, a planarization process such as a CMP process or a mechanical grinding process is performed, so that the portions of layers 152/252 and 158/258 over ILD 48 are removed. The remaining portion of gate dielectric 152/252 and gate electrode 158/258 in combination are referred to as replacement gates 150 and 250 hereinafter.

Self-aligned hard masks 160 and 260 are then formed in accordance with some embodiments. The self-aligned hard masks 160 and 260 are self-aligned to the underlying replacement gates 150 and 250, and are formed of a dielectric material(s) such as $ZrO_2$, $Al_2O_3$, SiON, SiCN, $SiO_2$, or the like, and may be free from SiN. The formation process may include etching replacement gates 150 and 250 to form recesses, filling the dielectric material into the recesses, and performing a planarization process to remove excess portions of the dielectric material. The top surfaces of hard masks 160 and 260, gate spacers 138 and 238, CESL 46, and ILD 48 may be substantially coplanar at this time.

Figure 8A:
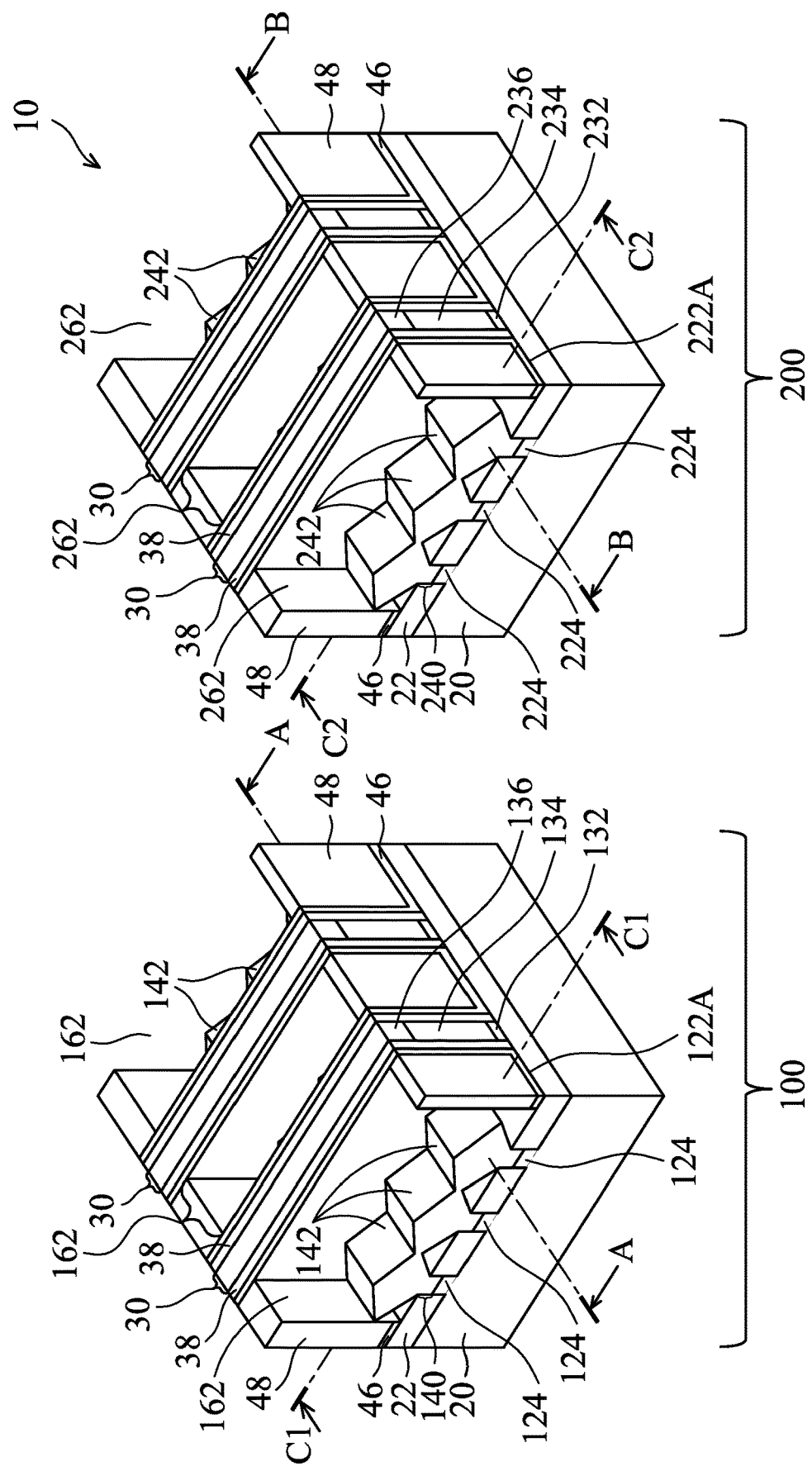
Figure 8B:
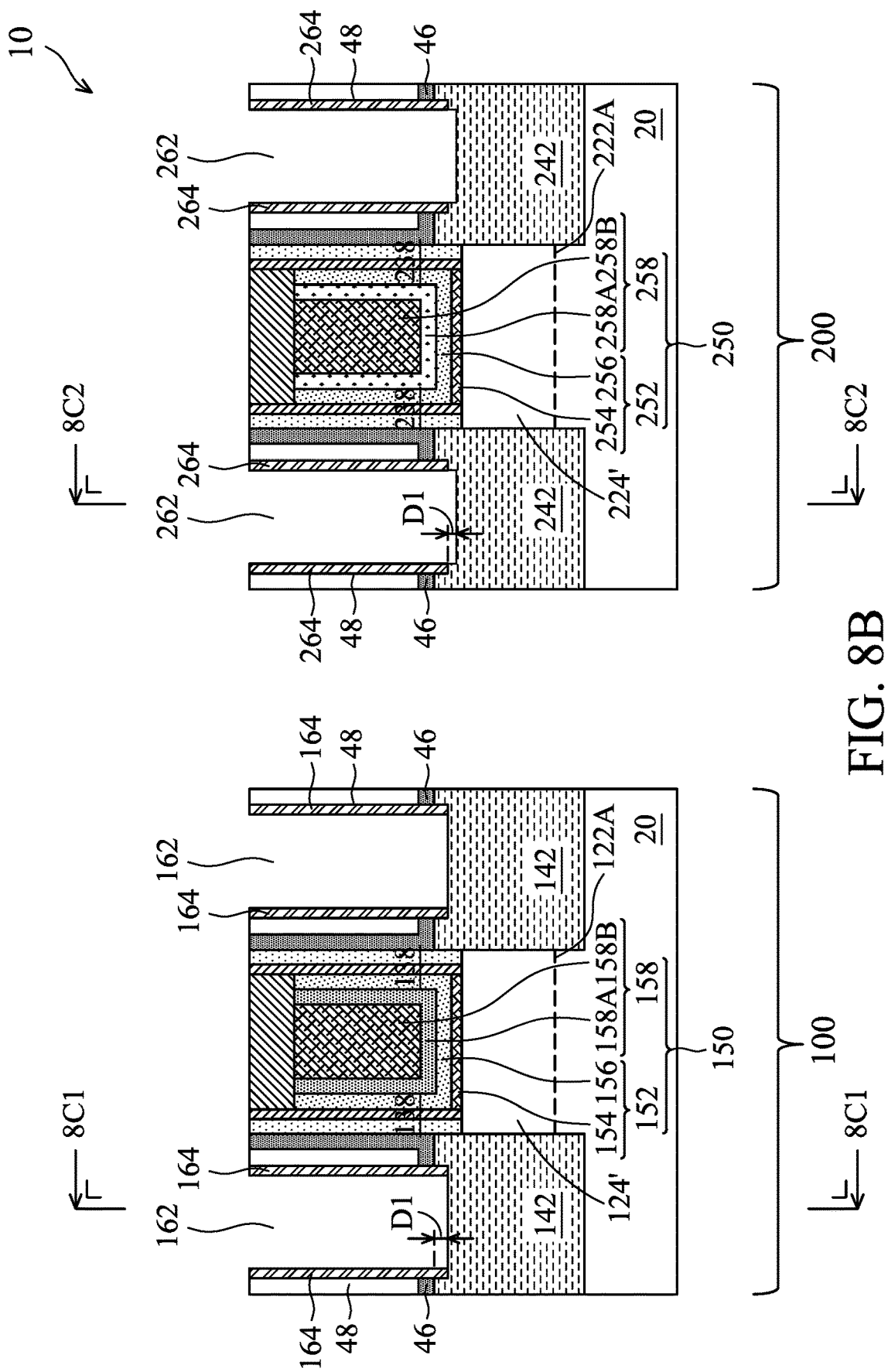

Referring to FIGS. 8A and 8B, ILD 48 and CESL 46 are etched to form source/drain contact openings 162 and 262. The respective process is illustrated as process 312 in the process flow 300 as shown in FIG. 21. CESL 46 is used as an etch stop layer in the etching of ILD 48, and then CESL 46 is etched, exposing the underlying source/drain regions 142 and 242. Contact openings 162 and 262 may be formed simultaneously, or may be formed separately. FIG. 8B illustrates the cross-sectional views obtained from the vertical planes containing lines A-A and B-B in FIG. 8A. Due to the over-etching, openings 162 and 262 may extend slightly into source/drain regions 142 and 242, as shown in FIG. 8B, for example, with depths D1 smaller than about 5 nm.

Also referring to FIG. 8B, after the formation of contact openings 162 and 262, contact spacers 164 and 264 are formed on the sidewalls of source/drain regions 142 and 242, CESL 46, and ILD 48. The respective process is illustrated as process 314 in the process flow 300 as shown in FIG. 21. The formation of contact spacers 164 and 264 may include forming a dielectric layer, and then performing an anisotropic etch to remove horizontal portions of the dielectric layer, leaving vertical portions as the contact spacers. In accordance with some embodiments of the present disclosure, the dielectric layer is formed using a conformal deposition method such as CVD or ALD. The dielectric layer may be a high-k dielectric layer with a k value greater than 3.9, so that it has good isolation ability. The candidate materials include $Al_xO_y$, $HfO_2$, and SiOCN (with no pores or substantially no pores inside), and may be free from SiN when $CF_4$ or similar gases are used in the subsequent etch-back of source/drain regions. The thickness of the dielectric layer may be in the range between about 2 nm and about 6 nm, for example. Each of contact spacers 164 and 264 may form a ring when viewed from the top of wafer 10. In accordance with alternative embodiments, the formation of contact spacers 164 and 264 is skipped.

Figure 8C:
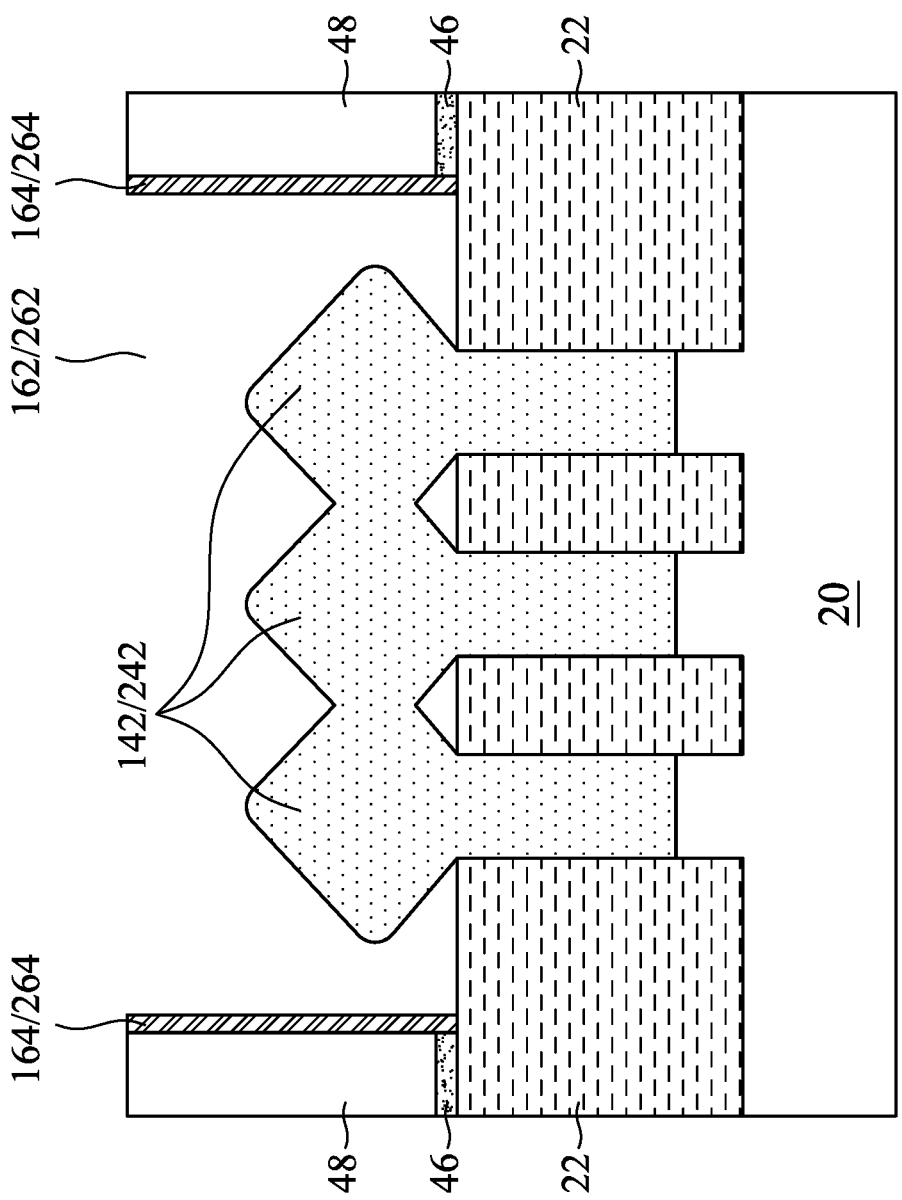

FIG. 8C illustrates a cross-sectional view of the either one of the structure in device region 100 and 200, wherein the cross-sectional view is obtained from the plane crossing line C1-C1 or line C2-C2 in FIG. 8A. The cross-sectional view shown in FIG. 8C is also obtained from the plane containing line 8C1-8C1 or line 8C2-8C2 in FIG. 8B.

Figure 9:
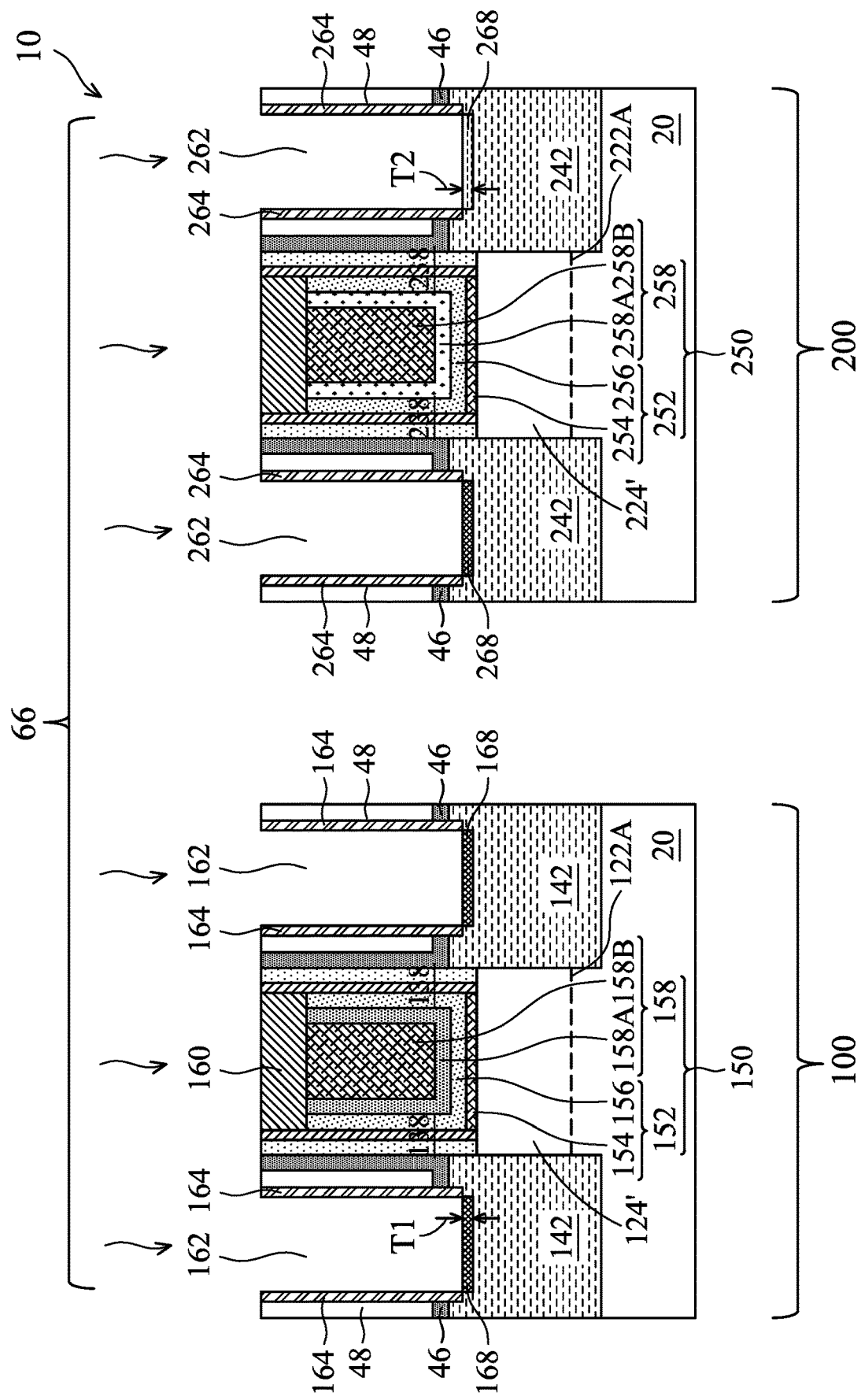
Figure 10A:
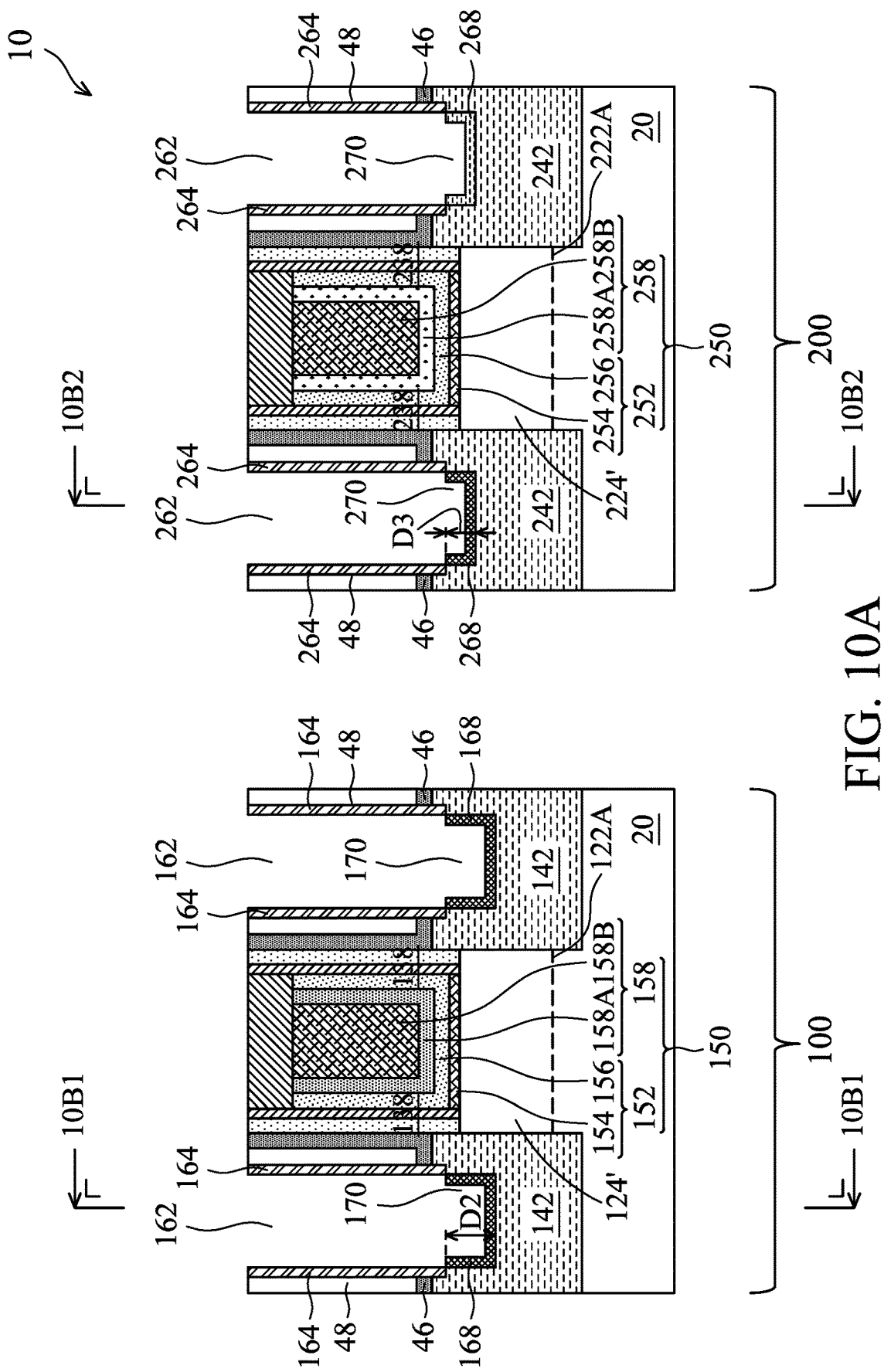
Figure 10B:
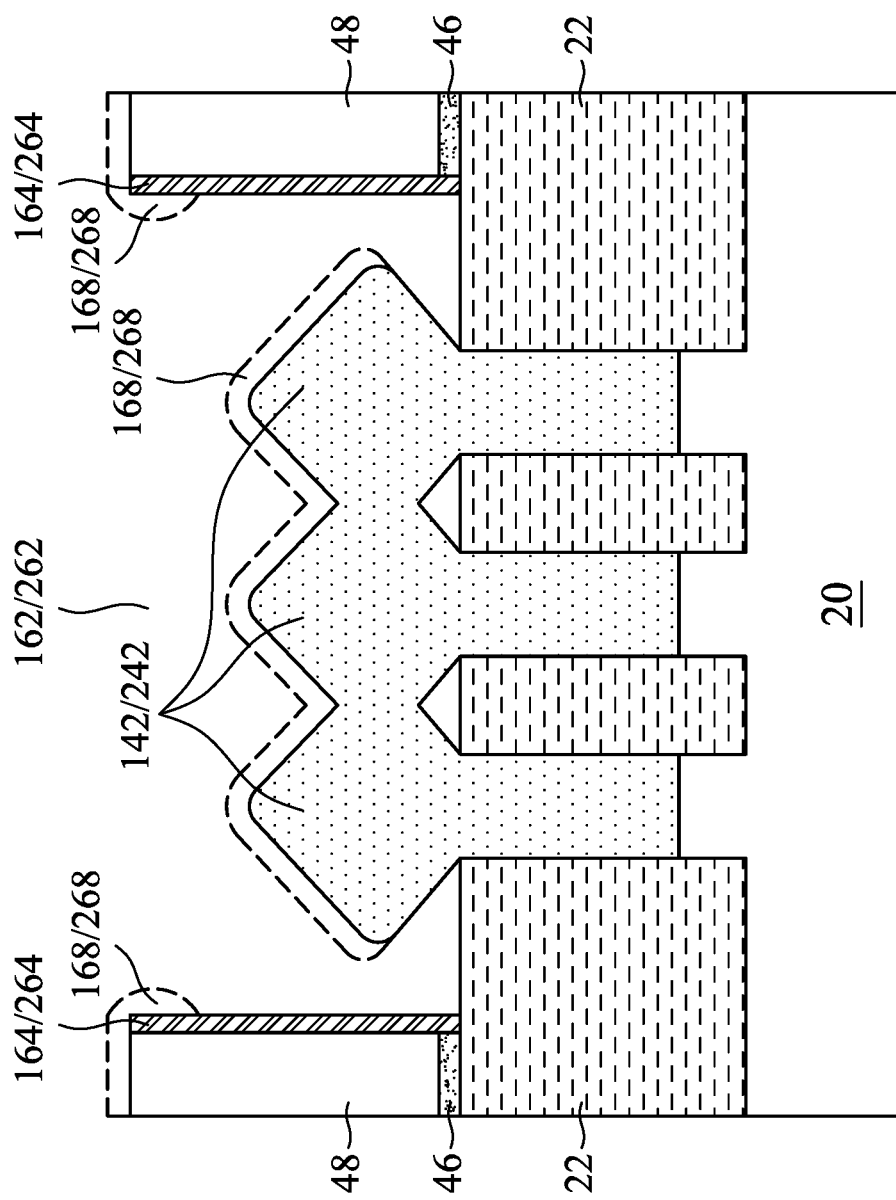
Figure 11:
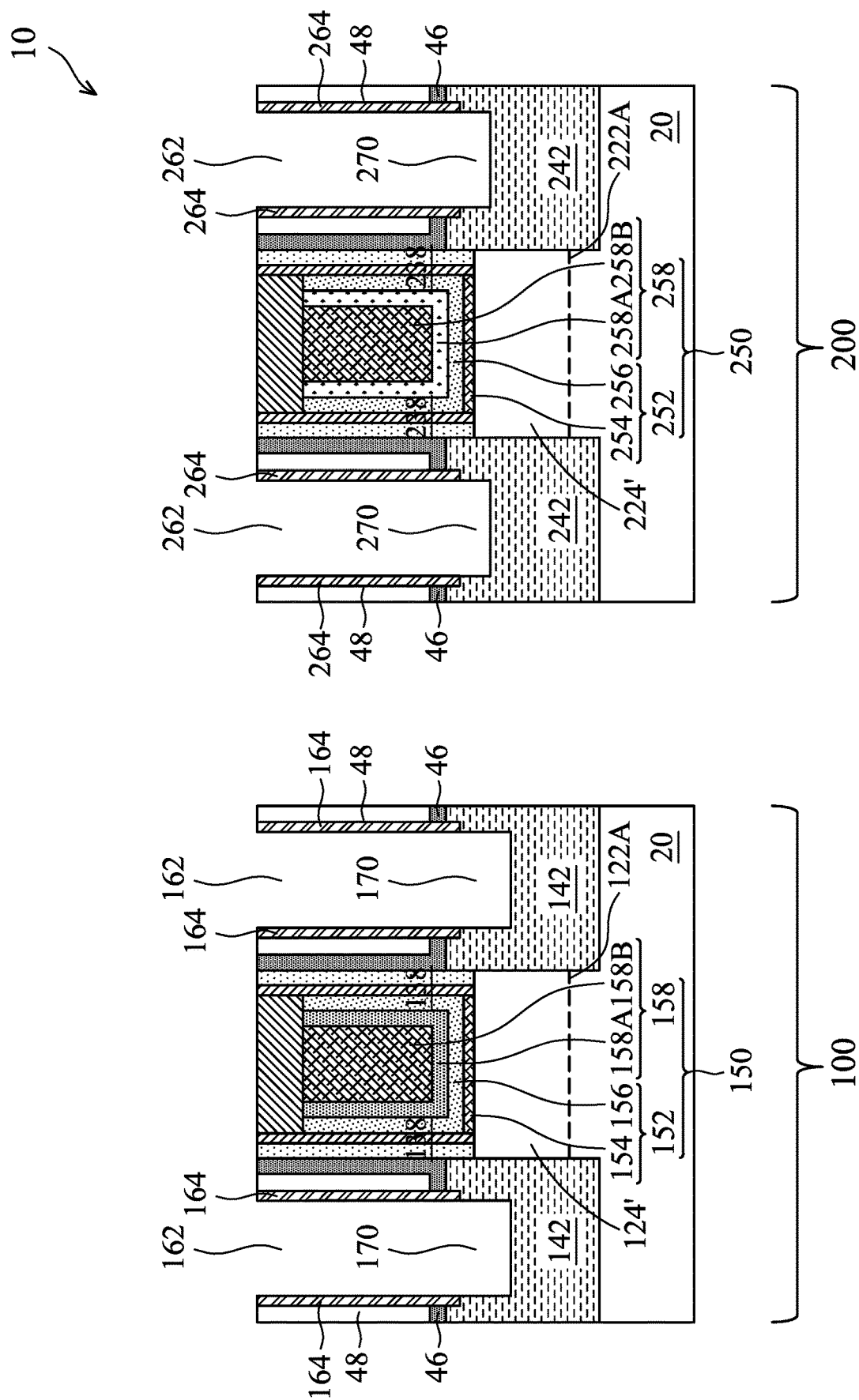

FIGS. 9 through 11 illustrate the etch-back of source/drain regions 142. The respective process is illustrated as process 316 in the process flow 300 as shown in FIG. 21. In accordance with some embodiments of the present disclosure, in the etch-back, both source/drain regions 142 and 242 are exposed to the same process gas to save manufacturing cost, and hence both source/drain regions 142 and 242 are subject to the etching. The etch-back of n-type source/drain regions 142 of the resulting n-type FinFET may increase the contact area, as will be discussed in subsequent paragraphs. Accordingly, the contact resistance of contact plugs to source/drain regions 142 is reduced, and the device performance is improved. On the other hand, the etch-back of p-type source/drain regions 242 of the resulting p-type FinFET is intended to be minimal. This is because it is difficult to dope the entire source/drain regions 242 heavily with a p-type dopant such as boron. Accordingly, the top surface layers of source/drain regions 242 are heavily doped, while the lower layers are doped lighter than the top surface layers. For example, the top surface layer of source/drain regions 242 may have a p-type or n-type dopant concentration higher than about $1\times 10^{20}/cm^3$, or in the range between about $1\times 10^{20}/cm^3$ and about $1\times 10^{22}/cm^3$. The dopant concentration of the lower layers may be one or two orders than the dopant concentration of the top surface layer. For example, the dopant concentration of the lower layers may be in the range between about $1\times 10^{18}/cm^3$ and about $1\times 10^{20}/cm^3$. The top surface layers are thus not intended to be etched in the etch-back in order to preserve the high electrical conductivity resulted from the heavily-doped top surface layers of p-type source/drain regions 242.

In accordance with some embodiments, the etching gas, as represented by arrows 66, include a sulfur-containing gas, a polymer-generating gas, and an etching gas for etching source/drain regions 142. The polymer-generating gas and the etching gas may be the same gas in accordance with some embodiments. The sulfur-containing gas may include $SF_6$, carbonyl sulfide (COS, also known as carbon oxide sulfide), or the like. The polymer-generating gas may include $C_xH_yF_z$, with x, y, and z being integers. For example, the polymer-generating gas may include $CF_4$ (with x=1, y=0, and z=4), $CH_3F$, $CH_2F_2$, or the like. The etching gas may include $C_xH_yF_z$, HBr, $Cl_2$, and/or the like. Accordingly, $C_xH_yF_z$ may be used as both the polymer-generating gas and etching gas, while another etching gas may or may not be added. Hydrogen ($H_2$) may also be added into the process gas 66.

FIG. 9 illustrates an intermediate structure in the etching. After the etching is started, the germanium in source/drain regions 242 forms germanium sulfide such as GeS or $GeS_2$ with the sulfur-containing gas. The polymer-generating gas further results in the generation of a polymer, which may comprise fluorine and carbon. The mixture of the germanium sulfide with the polymer results in polymer layers 268 to be formed at the surface of source/drain regions 242. In the meantime, the polymer-generating gas results in the generation of polymer layers 168 on source/drain regions 142. Due to the germanium sulfide, thickness T2 of polymer layers 268 is greater than thickness T1 of polymer layers 168. The polymer layers 168 and 268 have the effect of reducing the etching rates of the source/drain regions 142 and 242, and the thicker polymer layer 268 results in source/drain regions 242 to have a lower etching rate than source/drain region 142. In accordance with some embodiments of the present disclosure, ratio T2/T1 may be adjusted to be greater than about 1.5, greater than about 2.0, or higher. At the same time polymer layers 168 and 268 are formed, the etching gas (which may be, or may not be, the polymer-generating gas) in process gas 66 etches source/drain regions 142, and may slightly etch source/drain regions 242. In subsequent discussion, the etching rate of source/drain region 142 is denoted as ER142, and the etching rate of source/drain region 242 is denoted as ER242. In accordance with some embodiments of the present disclosure, ER142 is greater than ER242.

To increase the difference between ER142 and ER242, the temperature of wafer 10 in the etching process is lowered. Reducing temperature may result in the reduction in the thickness of both polymer layers 168 and 268 at the bottoms of contact openings 162 and 262, hence the etching rates of regions 142 are improved. Since polymer layer 268 is thicker than polymer layer 168, the ratio T2/T1 is increased when temperature is lowered, hence the etching-rate ratio ER142/ER242 is increased. Experimental results revealed that when the temperature of wafer 10 (and the temperature of source/drain regions 142 and 242) is at about 50° C., the etching rate of SiGe is around 3.0 nm/minute, and the etching rate of SiP is around 9.2 nm/minute. When the temperature of wafer 10 (and the temperature of source/drain regions 142 and 242) is reduced to lower than 20° C., the etching rate of SiGe is about 3.5 nm/minute, and the etching rate of SiP is about 18.7 nm/minute. This indicates that with the lowering of the wafer temperature, the etch rate difference between SiP and SiGe is significantly increased. Accordingly, a low temperature is used in accordance with some embodiments to etch back source/drain region 142, while the etch-back of source/drain regions 242 may be minimized. In accordance with some embodiments of the present disclosure, the temperature of wafer 10 is adjusted (such as lowered) so that the ratio ER142/ER242 is greater than about 1.5, and may be greater than 2.0, greater than about 3.0, or higher. For example, ratio ER142/ER242 may be in the range between about 2.0 and about 3.5. The adopted wafer temperature during the etching may be lower than room temperature, and lower than about 20° C. in accordance with some embodiment. For example, the temperature of wafer 10 may be in the range between about 0° C. and about 20° C. or between about 0° C. and about 15° C. in accordance with some embodiments. In accordance with some embodiments of the present disclosure, wafer 10 is chilled through a chilling mechanism, for example, conducting a coolant into a conduit in the E-chuck for securing wafer 10 thereon.

In addition, in the etch-back, a low ion energy (of the plasma of the process gases) is used to reduce bombarding effect, so that the rate ratio ER142/ER242 is increased. For example, the ion energy may be smaller than about 0.5 keV. In the etching, $SiF_4$ and $CO_2$ gases may be generated, and are evacuated.

It is appreciated that the etching rates of source/drain region 142 and source/drain region 242, and the etching-rate ratio ER142/ER242 is affected by a plurality of result-affecting parameters including, and not limited to, the types and the flow rates of each of the sulfur-containing gas, the polymer-generating gas, and the etching gas, the wafer temperature, the composition (such as the germanium concentration) of source/drain regions 142 and 242, and the ion energy. Accordingly, experiments may be performed to adjust the result-affecting parameters to achieve a high ratio ER142/ER242. In the experiments, a plurality of sample wafers are formed to have the same structures of FIG. 8A (or having blanket semiconductor regions with the same compositions as regions 142 and 242). Different combinations of the result-affecting parameters as aforementioned are adopted to etch the sample wafers and to find the corresponding etching rates and ratios ER142/ER242. A combination of result-affecting parameters is selected, so that the etching rates and etching-rate ratio may have the desirable values. The selected combination of result-affecting parameters may be used to performing the etch-back on production wafers 10.

FIG. 10A illustrates wafer 10 at the time the etch-back is finished. In accordance with some embodiments, recesses 170 and 270 are formed to extend into source/drain regions 142 and 242, respectively, with recesses 170 and 270 having depths D2 and D3, respectively. Depths D2 and D3 may have a difference (D2−D3) greater than about 4 nm, which may be between about 4 nm and about 10 nm. Also, depth D3 is as small as possible, and may be smaller than about 1.5 nm. Depth D3 may be in the range between about 0.5 nm and about 1.5 nm. Depth D2 may be greater than about 5 nm, and may be in the range between about 5 nm and about 12 nm.

FIG. 10B illustrates a cross-sectional view of the structure shown in FIG. 10A, with the cross-sectional view obtained from the plane containing line 10B1-10B1 or line 10B2-10B2 in FIG. 10A. Accordingly, the illustrated structure in FIG. 10B may be the structure shown in device region 100 or the structure shown in device region 200 in FIG. 10A. The resulting polymer layers 168 and 268 are also illustrated in FIG. 10B using dashed lines. It is observed that polymer layers 168 and 268 are thicker on the top surfaces of the illustrated regions 48, 164/264, and 142/242, and are thinner on the sidewalls and deep in the contact openings 162/262.

Polymer layers 168 and 268 are then removed, resulting in the structure shown in FIG. 11. The removal of polymer layers 168 and 268 may be achieved using a dry or a wet process. When the dry process is used, a mixed gas of $N_2$ and $H_2$ may be used. When the wet process is used, diluted $O_3$ (in water) solution may be used. The germanium sulfide may be removed. In accordance with some embodiments of the present disclosure, there is some residue sulfur left in the top surface layer of source/drain regions 242 due to the diffusion, which top surface layer faces recess 270, and have a U-shape in the cross-sectional view shown in FIG. 11.

Figure 12:
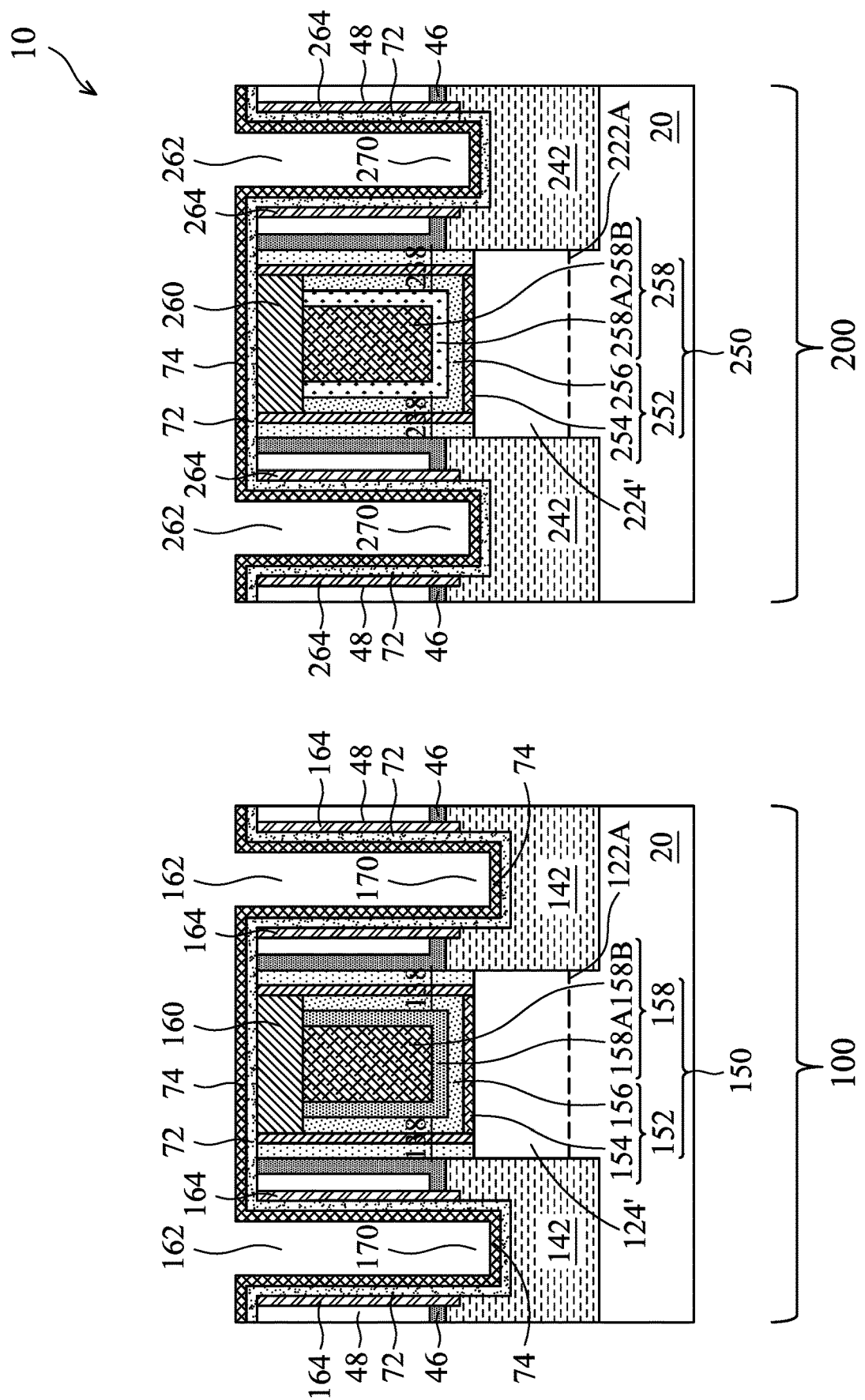
Figure 13:
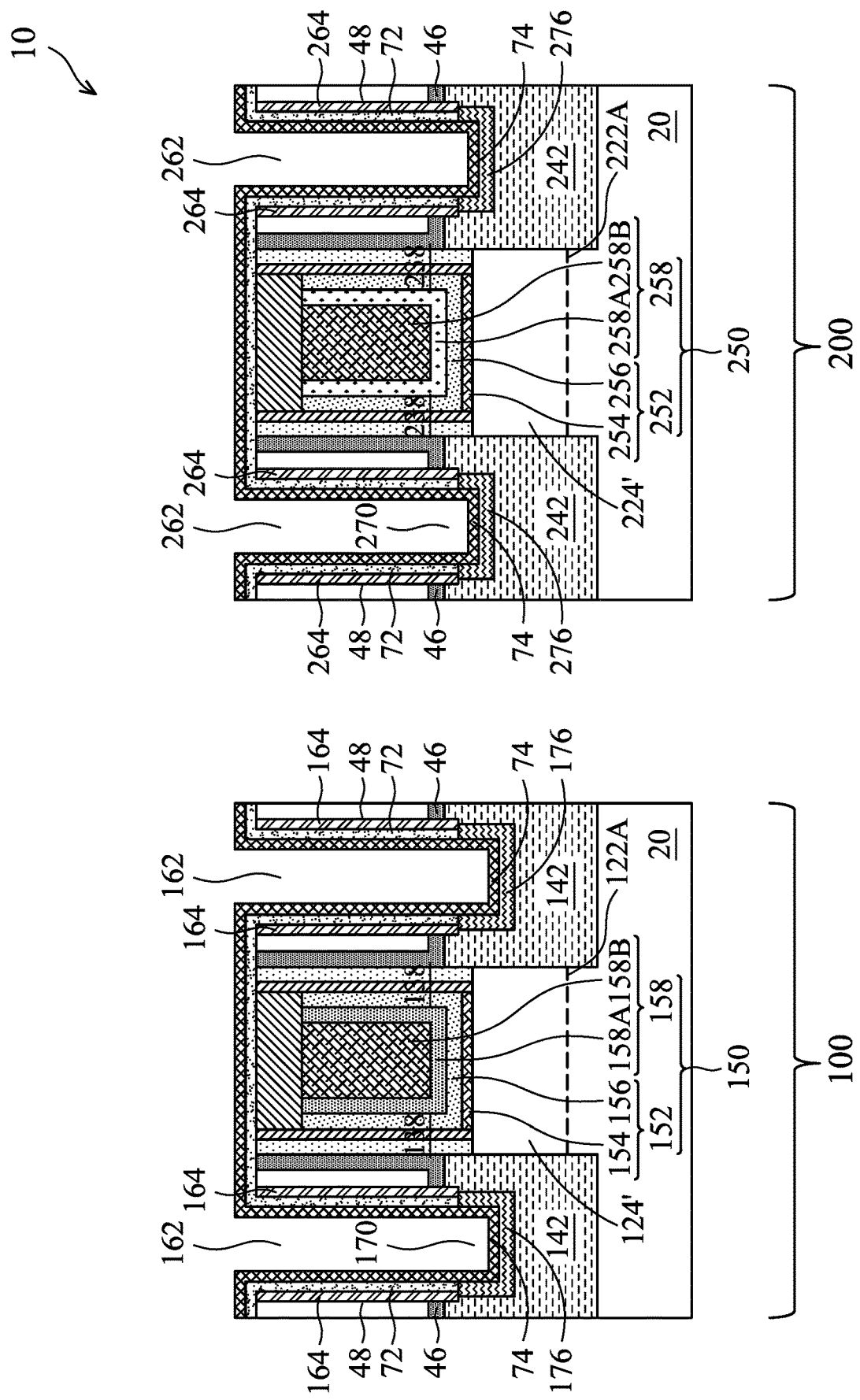

FIGS. 12 and 13 illustrate the formation of source/drain silicide regions. Referring to FIG. 12, metal layer 72 (such as a titanium layer or a cobalt layer) is deposited, for example, using Physical Vapor Deposition (PVD). Barrier layer 74, which may be a metal nitride layer such as a titanium nitride layer or a tantalum nitride layer, is then formed over metal layer 72. The respective process is illustrated as process 318 in the process flow 300 as shown in FIG. 21. Barrier layer 74 may be formed by nitridizing a top layer of metal layer 72, leaving the bottom layer of metal layer 72 not nitridized, or may be formed using a deposition method such as CVD. Layers 72 and 74 are both conformal, and extend into trenches 162/170 and 262/270.

An anneal is then performed to form source/drain silicide regions 176 and 276, as shown in FIG. 13. The respective process is illustrated as process 320 in the process flow 300 as shown in FIG. 21. The anneal may be performed through Rapid Thermal Anneal (RTA), furnace anneal, or the like. Accordingly, the bottom portion of metal layer 72 reacts with source/drain region 142 and 242 to form silicide regions 176 and 276, respectively. Some sidewall portions of metal layer 72 remain after the silicidation process. In accordance with some embodiments of the present disclosure, the top surfaces of silicide regions 176 and 276 are in contact with the bottom surface of the respective barrier layers 74. When some residue sulfur is left in the top surface layer of source/drain regions 242, the resulting source/drain silicide regions 276 may include the residue sulfur therein. In accordance with some embodiments, the underlying portions of source/drain regions 242 in contact with source/drain silicide regions 276 may or may not include residue sulfur.

Figure 14:
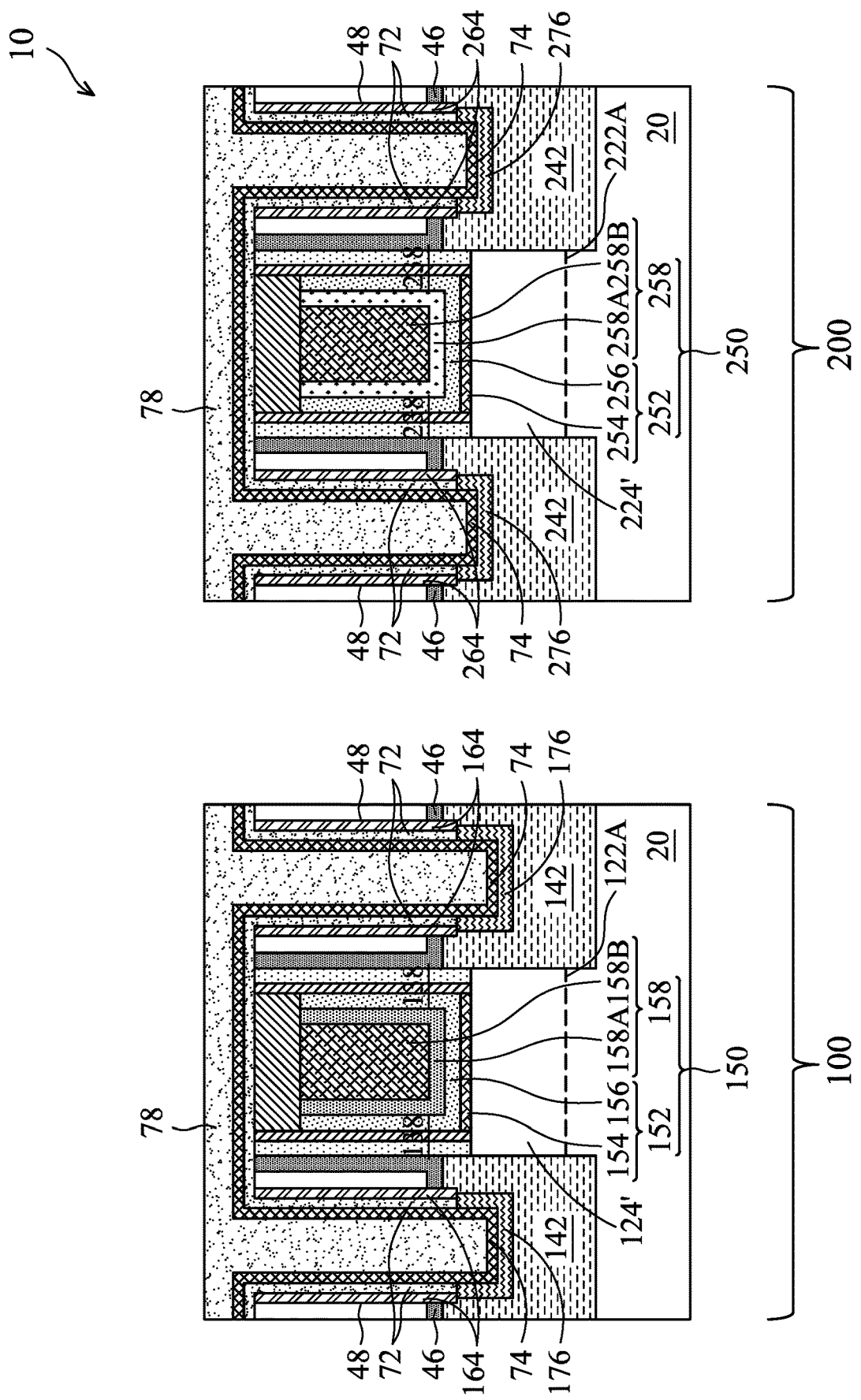
Figure 15:
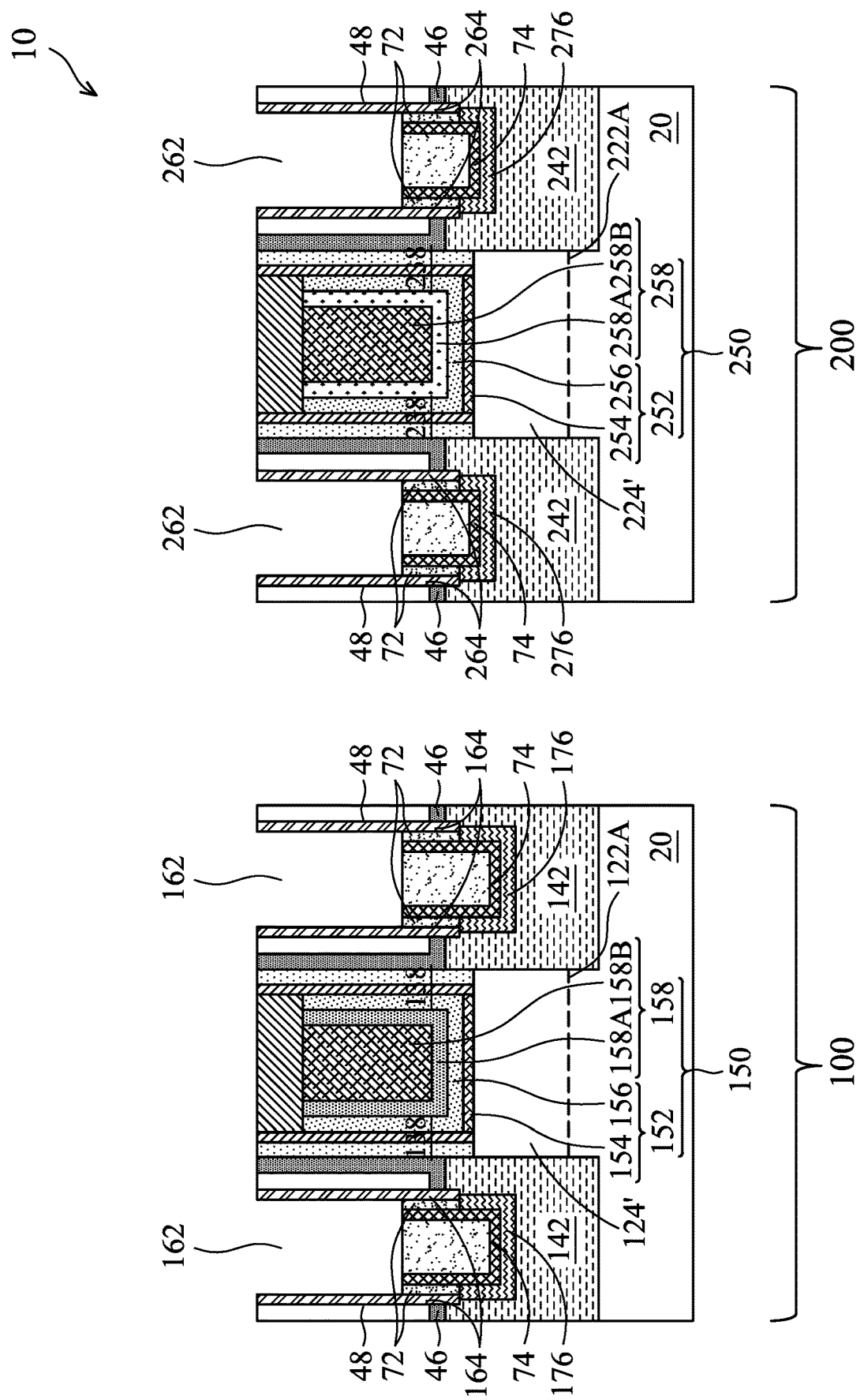
Figure 16:
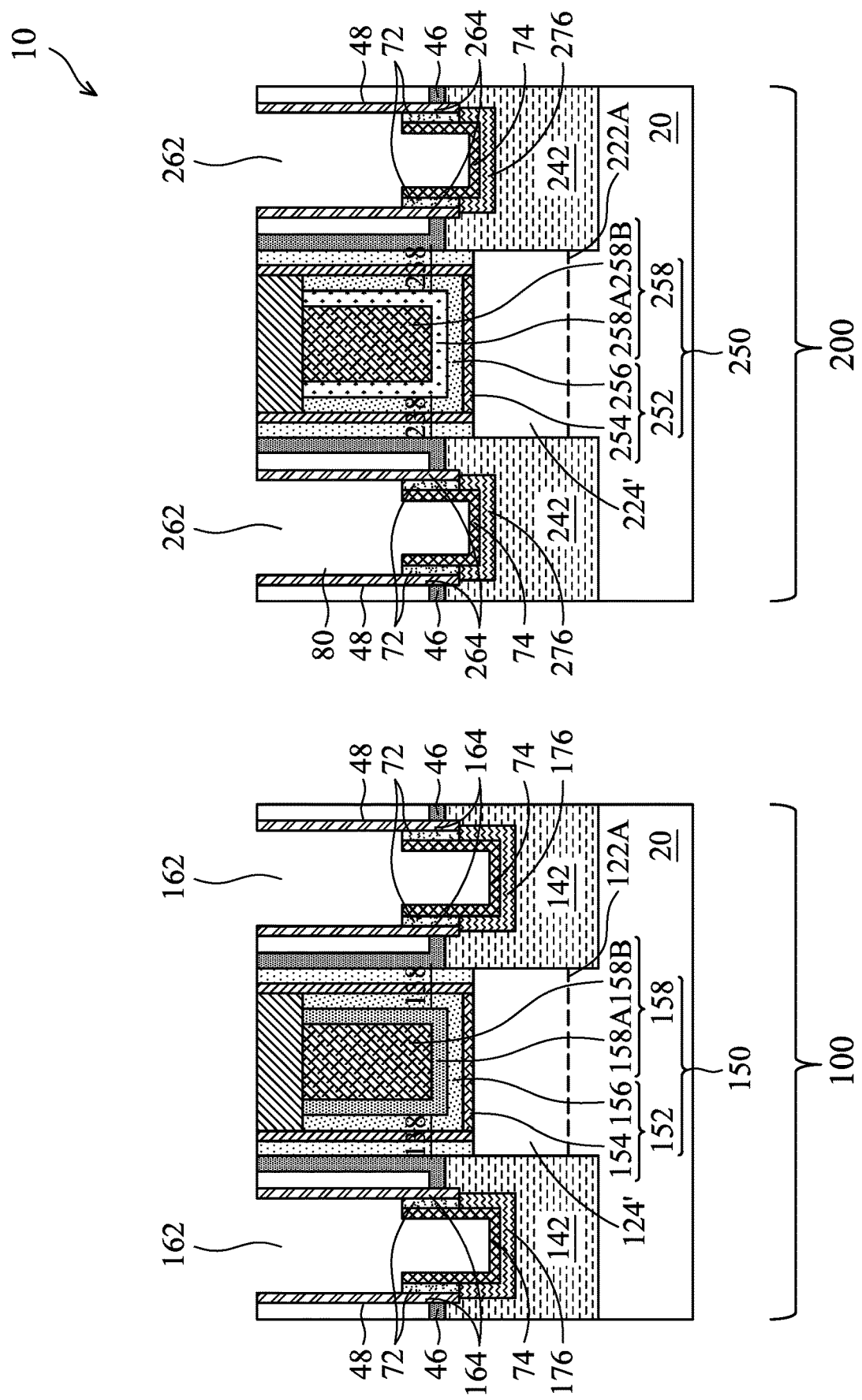

FIGS. 14 and 15 illustrate the pull-back of barrier layer 74. The respective process is illustrated as process 322 in the process flow 300 as shown in FIG. 21. Referring to FIG. 14, sacrificial layer 78 is formed. In accordance with some embodiments, the pull-back is performed by covering some portions of wafer 10 with a Bottom Anti-Reflective Coating (BARC) and a photo resist (not shown) on wafer 10, and performing a light-exposure and development on the photo resist, so that the portion of the photo resist over the illustrated regions are removed. The BARC acts as the sacrificial layer 78.

Next, as shown in FIG. 15, sacrificial layer 78 is etched back, with a bottom portion of sacrificial layer 78 as shown in FIG. 14 remaining. An isotropic etching process, which may be a wet etching process, is then performed to remove the top portions of barrier layer 74 and metal layer 72, leaving the bottom portion that are protected by sacrificial layer 78 un-etched. The top ends of the remaining barrier layer 74 are higher than the top ends of silicide regions 176 and 276. The pull-back of barrier layer 74 advantageous enlarges the sizes of the top ends of openings 162 and 262, and hence the subsequent metal filling is easier, and the possibility of forming voids in the resulting source/drain contact plugs is reduced. After the pull-back, the remaining portions of sacrificial layer 78 are removed, resulting in the structure shown in FIG. 16.

Figure 17:
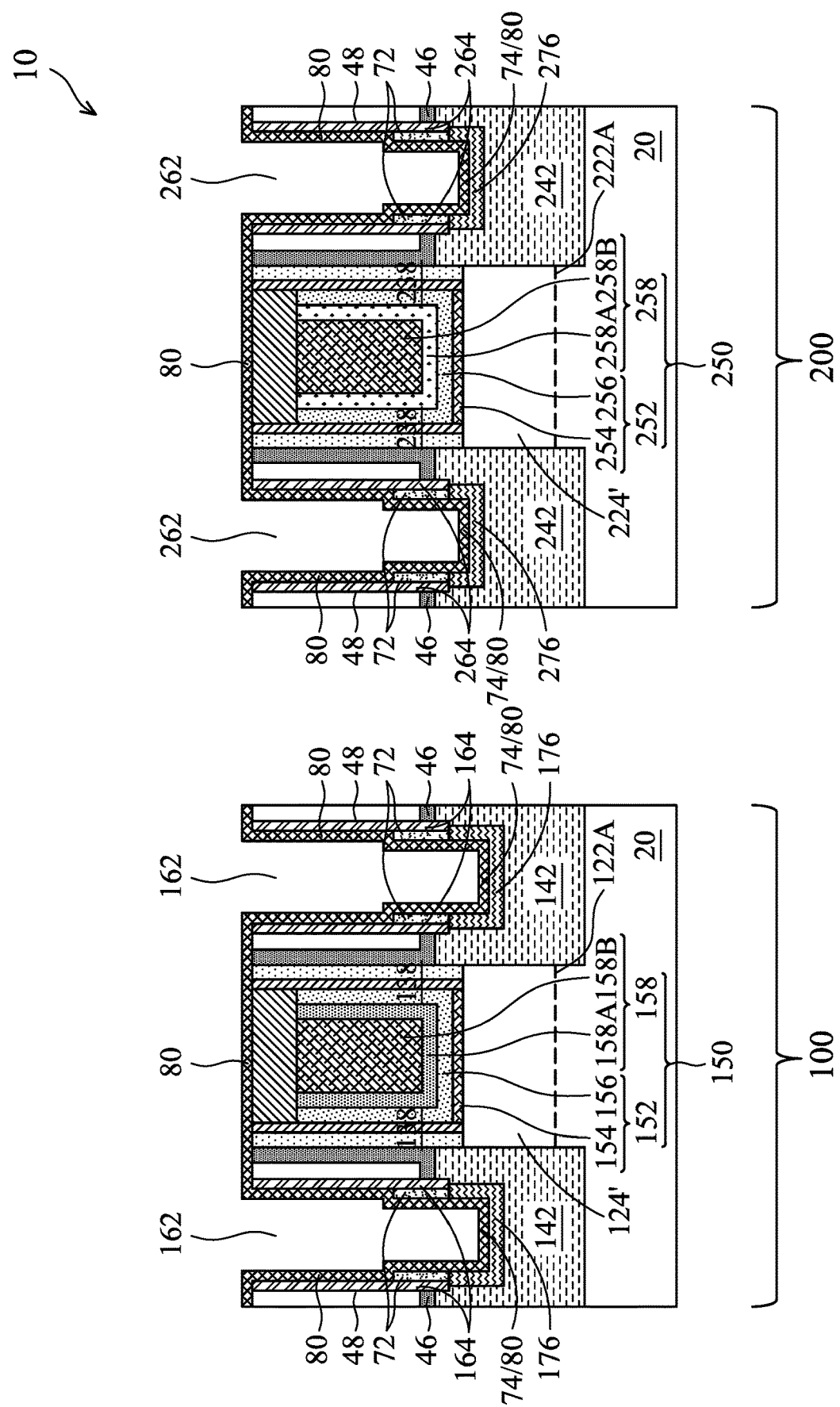

FIG. 17 illustrates the formation of an additional barrier layer 80. In accordance with some embodiments, barrier layer 80 is formed of titanium nitride, tantalum nitride, or the like. In FIG. 17, the remaining barrier layer 74 is not illustrated separately, while there may be, or may not be, distinguishable interfaces between barrier layers 74 and 80.

Figure 18:
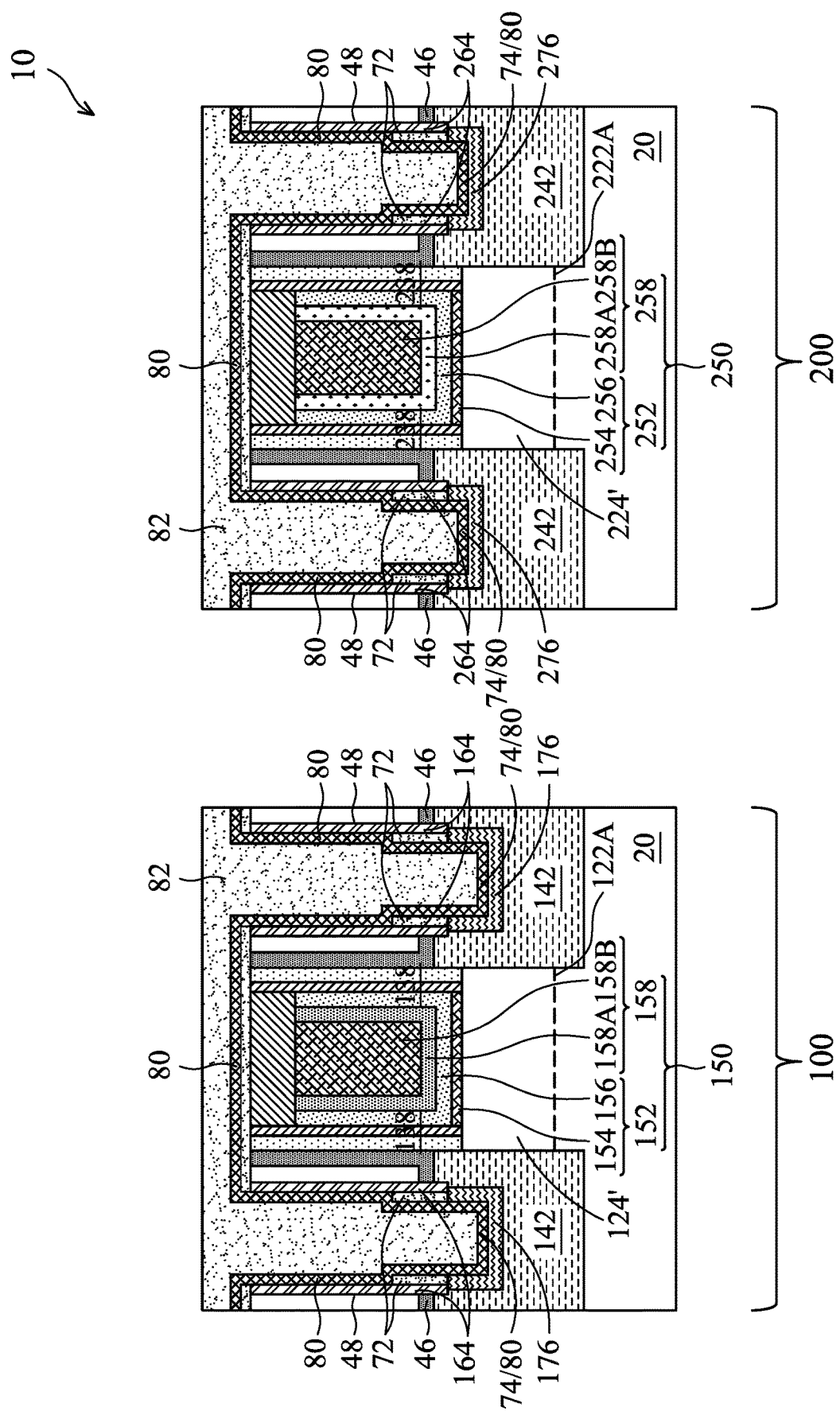
Figure 19:
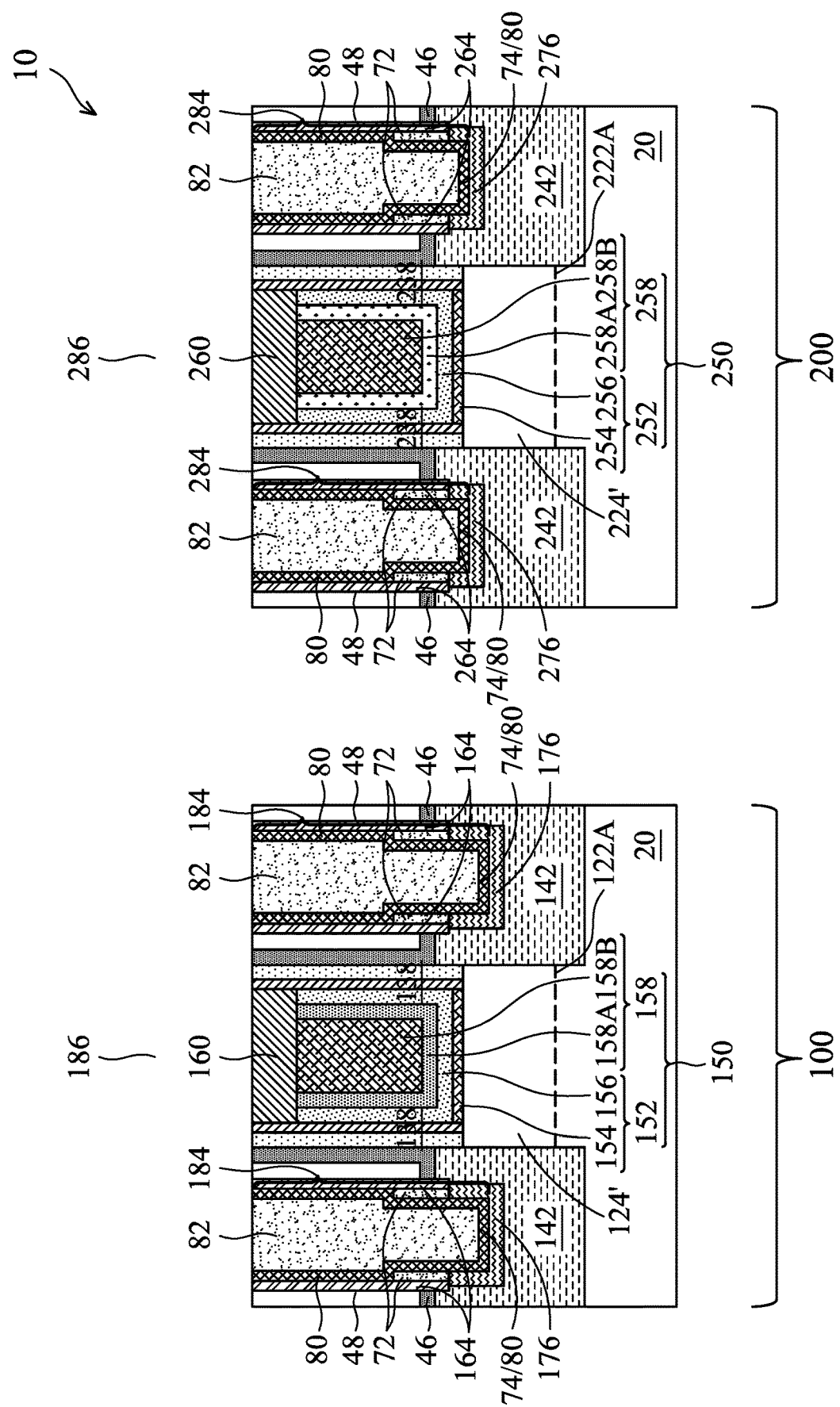

Next, as shown in FIG. 18, metallic material 82 is deposited over and in contact with barrier layer 80. Metallic material 82 may be selected from the same group of candidate materials for forming filling metal 60, and may include tungsten or cobalt. A planarization process such as a CMP process or a mechanical grinding process is then performed to remove the portions of layers 72, 80, and 82 over ILD 48. The resulting structure is shown in FIG. 19, which includes source/drain contact plugs 184 and 284. The respective process is illustrated as process 324 in the process flow 300 as shown in FIG. 21. N-type FinFET 186 and p-type FinFET 286 are thus formed.

Figure 20:
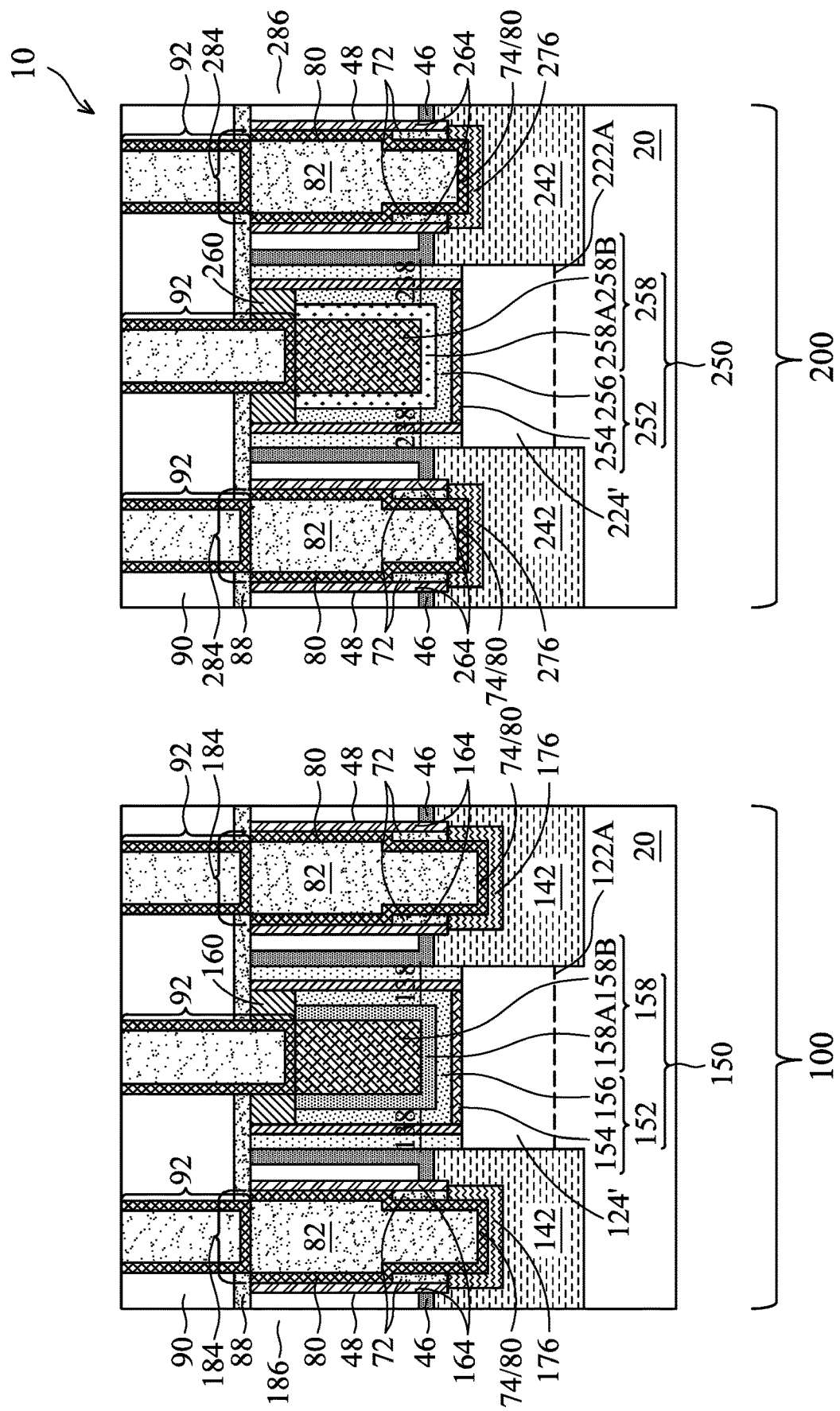

FIG. 20 illustrates the formation of etch stop layer 88, ILD 90, and contact plugs 92. In accordance with some embodiments, contact plugs 92 include gate contact plugs penetrating through hard masks 160 and 260 to contact gate electrodes 158 and 258.

As shown in FIG. 20, the recessing of source/drain region 142 results in the silicide regions 176 of n-type FinFET 186 to have added sidewall portions in addition to the bottom portions. The contact resistance between contact plugs 184 and silicide regions 176 is reduced due to the increased contact area. On the other hand, although etching back the source/drain region 242 may also result in increased area, since the heavily doped regions of source/drain region 242 are adversely etched, the overall performance of the p-type FinFET may be compromised if source/drain regions 242 are also etched back. Accordingly, the etch-back of source/drain region 242 is kept minimal to keep the overall resistance of source/drain regions of source/drain region 242 and the corresponding contacts low.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The embodiments of the present disclosure have some advantageous features. By adopting etching gases that can selectively etch the source/drain regions of n-type FinFETs, the n-type FinFETs may have increased areas of silicide regions, and hence the contact resistance is reduced. On the other hand, the etching of heavily-doped portions of the source/drain region of p-type FinFETs are kept minimal, and the overall resistance of the source/drain regions of the p-type FinFETs is not compromised. Exposing the source/drain regions of n-type and p-type FinFETs to the same etching gases without masking the p-type FinFETs may save the lithography process for masking the p-type FinFETs and hence saving manufacturing cost.

In accordance with some embodiments of the present disclosure, a method includes forming an inter-layer dielectric over a first source/drain region and a second source/drain region, wherein the first source/drain region and the second source/drain region are of n-type and p-type, respectively; etching the inter-layer dielectric to form a first contact opening and a second contact opening, with the first source/drain region and the second source/drain region exposed to the first contact opening and the second contact opening, respectively; conducting a process gas to etch back the first source/drain region and the second source/drain region simultaneously, wherein a first etching rate of the first source/drain region is higher than a second etching rate of the second source/drain region; and forming a first silicide region and a second silicide region on the first source/drain region and the second source/drain region, respectively. In an embodiment, the process gas comprises: a sulfur-containing gas; and a carbon-and-fluorine containing gas. In an embodiment, the process gas further comprises HBr or $Cl_2$. In an embodiment, the method further comprises before the conducting the process gas, adjusting a temperature of a wafer that comprises the first source/drain region and the second source/drain region to lower than about 20° C. In an embodiment, the first source/drain region comprises silicon and is free from germanium, and the second source/drain region comprises silicon germanium. In an embodiment, a ratio of the first etching rate to the second etching rate is higher than about 1.5. In an embodiment, in the etching, a first polymer layer comprising carbon and fluorine is formed on the first source/drain region, and a second polymer layer comprising carbon, fluorine, germanium, and sulfur is formed on the second source/drain region. In an embodiment, in the etching, a ratio of a first thickness of the first polymer layer to a second thickness of the second polymer layer is greater than about 2.0. In an embodiment, the method further includes removing the first polymer layer and the second polymer layer before the first silicide region and the second silicide region are formed.

In accordance with some embodiments of the present disclosure, a method includes forming a dielectric layer over a first source/drain region; etching the dielectric layer to form a first contact opening, with a top surface of the first source/drain region exposed to the first contact opening; etching back the first source/drain region using a process gas comprising a sulfur-containing gas and a polymer-generating gas; and generating a first silicide region on the recessed first source/drain region. In an embodiment, the sulfur-containing gas comprises $SF_6$ or carbon oxide sulfide. In an embodiment, the sulfur-containing gas comprises $SF_6$. In an embodiment, the sulfur-containing gas comprises carbon oxide sulfide. In an embodiment, the first source/drain region is of n-type, and the method further comprises: etching the dielectric layer to form a second contact opening, with a top surface of a second source/drain region exposed to the second contact opening, and the second source/drain region is of p-type and is exposed to the process gas when the first source/drain region is etched back; and generating a second silicide region on the second source/drain region. In an embodiment, in the etching back the first source/drain region, a ratio of a first etching rate of the first source/drain region to a second etching rate of the second source/drain region is greater than about 1.5. In an embodiment, in the etching back the first source/drain region, adjusting a temperature of the first source/drain region to achieve the ratio.

In accordance with some embodiments of the present disclosure, a method includes performing a first epitaxy to form a first source/drain region for an n-type FinFET; etching-back the first source/drain region using a process gas, wherein the process gas comprises carbon oxide sulfide and a carbon-and-fluorine containing gas, wherein the etching-back generates a recess extending from a top surface of the first source/drain region into the first source/drain region; and forming a first silicide region on the first source/drain region, wherein the first silicide region comprises a bottom portion and sidewall portions over and connected to opposite ends of the bottom portion. In an embodiment, the process gas further comprises an etching gas configured to etch back the first source/drain region. In an embodiment, the method further includes performing a second epitaxy to form a second source/drain region for a p-type FinFET, wherein in the etching-back, the second source/drain region is exposed to the process gas. In an embodiment, the method further comprises before the etching-back, adjusting a temperature of a wafer comprising the first source/drain region to lower than about 20° C., wherein in the etching-back, the wafer is at the temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an inter-layer dielectric over a first source/drain region and a second source/drain region, wherein the first source/drain region and the second source/drain region are of n-type and p-type, respectively;
   etching the inter-layer dielectric to form a first contact opening and a second contact opening, so that the first source/drain region and the second source/drain region exposed to the first contact opening and the second contact opening, respectively;
   conducting a process gas to etch back the first source/drain region and the second source/drain region simultaneously, wherein a first polymer layer and a second polymer layer are generated on the first source/drain region and the second source/drain region, respectively; and forming a first silicide region and a second silicide region on the first source/drain region and the second source/drain region, respectively.

2. The method of claim 1, wherein the process gas comprises an etching gas and a polymer-generating gas.

3. The method of claim 2, wherein the etching gas comprises a sulfur-containing gas, and the polymer-generating gas comprises a carbon-and-fluorine containing gas.

4. The method of claim 3, wherein the process gas further comprises HBr or $Cl_2$.

5. The method of claim 1 further comprising, before the conducting the process gas, adjusting a temperature of a wafer that comprises the first source/drain region and the second source/drain region to lower than 20° C.

6. The method of claim 1, wherein when the first source/drain region and the second source/drain region are etched back, a first etching rate of the first source/drain region is higher than a second etching rate of the second source/drain region.

7. The method of claim 6, wherein a ratio of the first etching rate to the second etching rate is higher than about 1.5.

8. The method of claim 1, wherein the first polymer layer comprises carbon and fluorine, and the second polymer layer comprises carbon, fluorine, germanium, and sulfur.

9. The method of claim 1, wherein when the first source/drain region and the second source/drain region are etched back, a ratio of a first thickness of the first polymer layer to a second thickness of the second polymer layer is greater than about 2.0.

10. The method of claim 1 further comprising removing the first polymer layer and the second polymer layer before the first silicide region and the second silicide region are formed.

11. A method comprising:
forming a first polymer layer on a first source/drain region;
etching-back the first source/drain region using a process gas, wherein the first source/drain region is etched through the first polymer layer, and wherein the etching-back generates a recess extending from a top surface of the first source/drain region into the first source/drain region; and
forming a first silicide region on the first source/drain region, wherein the first silicide region comprises a bottom portion and sidewall portions over and connected to opposite ends of the bottom portion.

12. The method of claim 11, wherein the first polymer layer is generated at a same time the first source/drain region is etched.

13. The method of claim 11, wherein the first polymer layer is generated using a polymer-generating gas, and the first source/drain region is etched using an etching gas, and the polymer-generating gas and the etching gas are used simultaneously.

14. The method of claim 11 further comprising:
when the first polymer layer is formed, simultaneously forming a second polymer layer on a second source/drain region; and
when the first source/drain region is etched, simultaneously etching-back the second source/drain region, wherein the second source/drain region is etched through the second polymer layer, and the first source/drain region is etched faster than the second source/drain region.

15. The method of claim 14, wherein the first source/drain region is of n-type, and the second source/drain region is of p-type.

16. A method comprising:
forming an inter-layer dielectric over a first source/drain region and a second source/drain region, wherein the first source/drain region and the second source/drain region are of n-type and p-type, respectively;
etching the inter-layer dielectric to reveal the first source/drain region and the second source/drain region;
performing an etching process to simultaneously etch back the first source/drain region and the second source/drain region, wherein in the etching, a first polymer layer is formed on the first source/drain region, and a second polymer layer is formed on the second source/drain region, and wherein the etching process is conducted through the first polymer layer and the second polymer layer, and wherein a first etching rate of the first source/drain region is higher than a second etching rate of the second source/drain region; and
forming a first silicide region and a second silicide region on the first source/drain region and the second source/drain region, respectively.

17. The method of claim 16, wherein the first source/drain region and the second source/drain region are etched using a process gas comprising:
a sulfur-containing gas; and
a carbon-and-fluorine containing gas.

18. The method of claim 16, wherein the first source/drain region and the second source/drain region are etched at a temperature lower than 20° C.

19. The method of claim 16, wherein a ratio of the first etching rate to the second etching rate is greater than about 1.5.

20. The method of claim 16, wherein in the etching, a ratio of a first thickness of the first polymer layer to a second thickness of the second polymer layer is greater than about 2.0.

* * * * *